(12) United States Patent
Sakakibara et al.

(10) Patent No.: US 9,170,488 B2
(45) Date of Patent: Oct. 27, 2015

(54) RESIST PATTERN-FORMING METHOD, AND RADIATION-SENSITIVE RESIN COMPOSITION

(71) Applicant: JSR CORPORATION, Tokyo (JP)

(72) Inventors: Hirokazu Sakakibara, Tokyo (JP); Taiichi Furukawa, Tokyo (JP); Reiko Kimura, Tokyo (JP); Masafumi Hori, Tokyo (JP)

(73) Assignee: JSR CORPORATION, Tokyo (JP)

(*) Notice: Subject to any disclaimer, the term of this patent is extended or adjusted under 35 U.S.C. 154(b) by 0 days.

(21) Appl. No.: 14/307,296

(22) Filed: Jun. 17, 2014

(65) Prior Publication Data

US 2014/0295350 A1    Oct. 2, 2014

Related U.S. Application Data

(63) Continuation of application No. 13/861,416, filed on Apr. 12, 2013, now Pat. No. 8,795,954, which is a continuation of application No. PCT/JP2011/070197, filed on Sep. 5, 2011.

(30) Foreign Application Priority Data

Oct. 15, 2010   (JP) .................................. 2010-233027
Mar. 24, 2011   (JP) .................................. 2011-066669

(51) Int. Cl.
*G03F 7/26*   (2006.01)
*G03F 7/004*   (2006.01)
*G03F 7/038*   (2006.01)
*G03F 7/039*   (2006.01)
*G03F 7/20*   (2006.01)
*G03F 7/32*   (2006.01)

(52) U.S. Cl.
CPC ............... *G03F 7/004* (2013.01); *G03F 7/038* (2013.01); *G03F 7/0392* (2013.01); *G03F 7/0397* (2013.01); *G03F 7/2041* (2013.01); *G03F 7/325* (2013.01); *G03F 7/0045* (2013.01); *G03F 7/0046* (2013.01)

(58) Field of Classification Search
CPC ..... G03F 7/0392; G03F 7/0045; G03F 7/004; G03F 7/40; G03F 7/2024; G03F 7/38; G03F 7/0382; C08L 101/02; C08K 5/205; C08K 5/375; H01L 21/0273; H01L 24/11; H01L 21/0271; H01L 21/0274
USPC ................................................. 430/322, 331
See application file for complete search history.

(56) References Cited

U.S. PATENT DOCUMENTS

| | | | |
|---|---|---|---|
| 4,910,122 A | 3/1990 | Arnold et al. | |
| 7,569,326 B2 | 8/2009 | Ohsawa et al. | |
| 2004/0072094 A1 | 4/2004 | Shima et al. | |
| 2006/0234154 A1 | 10/2006 | Nishimura et al. | |
| 2008/0187860 A1 | 8/2008 | Tsubaki et al. | |
| 2009/0269696 A1 | 10/2009 | Ohsawa et al. | |
| 2011/0177462 A1 | 7/2011 | Hatakeyama et al. | |
| 2011/0294069 A1 | 12/2011 | Bae et al. | |
| 2012/0009527 A1 | 1/2012 | Hatakeyama et al. | |
| 2013/0164695 A1* | 6/2013 | Nishimura et al. | 430/326 |

FOREIGN PATENT DOCUMENTS

| | | |
|---|---|---|
| JP | 06-12452 B2 | 5/1984 |
| JP | 59-93448 A | 5/1984 |
| JP | 05-188598 A | 7/1993 |
| JP | 2000199953 A | 7/2000 |
| JP | 2002525683 A | 8/2002 |
| JP | 2003-043678 A | 2/2003 |
| JP | 3869306 B2 | 5/2003 |
| JP | 2005352384 A | 12/2005 |
| JP | 2008058538 A | 3/2008 |
| JP | 2008281974 A | 11/2008 |
| JP | 2008292975 A | 12/2008 |
| JP | 2009-025707 A | 2/2009 |
| JP | 2009025708 A | 2/2009 |
| JP | 2009025723 A | 2/2009 |
| JP | 2009211051 A | 9/2009 |
| JP | 2009258585 A | 11/2009 |
| JP | 2009258586 A | 11/2009 |
| JP | 2010-039476 A | 2/2010 |
| JP | 2010024330 A | 2/2010 |
| JP | 2010-066503 A | 3/2010 |
| JP | 2010139996 A | 6/2010 |
| JP | 2010-152349 A | 7/2010 |
| JP | 2010152353 A | 7/2010 |
| JP | 2011-209520 A | 10/2011 |
| JP | 2011203644 A | 10/2011 |
| JP | 2011-221501 A | 11/2011 |
| JP | 2011221513 A | 11/2011 |
| JP | 2012-027438 A | 2/2012 |
| JP | 2012-153874 A | 8/2012 |
| TW | 200839467 A | 10/2008 |
| WO | 2004068242 A1 | 8/2004 |
| WO | 2007116664 A1 | 10/2007 |
| WO | 2008153109 A1 | 12/2008 |
| WO | 2008153110 A1 | 12/2008 |
| WO | 2010007993 A1 | 1/2010 |
| WO | 2010119910 A1 | 10/2010 |

OTHER PUBLICATIONS

Final Office Action for U.S. Appl. No. 13/855,749, dated Jun. 2, 2014, 5 pages.

(Continued)

*Primary Examiner* — Caleen Sullivan
(74) *Attorney, Agent, or Firm* — Oblon, McClelland, Maier & Neustadt, L.L.P.

(57) ABSTRACT

A resist pattern-forming method includes coating a radiation-sensitive resin composition on a substrate to provide a resist film. The resist film is exposed. The exposed resist film is developed using a developer solution including no less than 80% by mass of an organic solvent. The radiation-sensitive resin composition includes a polymer, a radiation-sensitive acid generator, and an acid diffusion controller which includes a compound having an amide group. The polymer has a weight average molecular weight in terms of the polystyrene equivalent of greater than 6,000 and includes a first structural unit that includes an acid-labile group. The polymer includes less than 5 mol % or 0 mol % of a second structural unit that includes a hydroxyl group.

10 Claims, No Drawings

(56) References Cited

OTHER PUBLICATIONS

Japanese Office Action for Corresponding JP Application No. 2011-043032, Apr. 8, 2014.
Office Action with Form PTO-892 Notice of References Cited issued by the U.S. Patent and Trademark Office for U.S. Appl. No. 13/855,749, Dec. 11, 2013.
Lee et al. Double exposure technology using silicon containing material, SPIE, 2006, vol. 6153, pp. 1-7.
Nishikubo et al. "Convenient Syntheses of Cyclic Carbonates by new Reaction of Oxtranes with [Bet]-Butyrolactone" Tetrahedron Letters, pp. 3741-3744, vol. 27, No. 32 1986.
Calo et al. "Cyclic Carbonate Formation from Carbon Dioxide and Oxiranes in Tetrabutylammonium Halides as Solvents and Catalysts", Organic Letters, 2002, pp. 2561-2563, vol. 4, No. 15.
International Search Report for Corresponding International Application No. PCT/JP2011/056120, Jun. 7, 2011.
International Search Report for Corresponding International Application No. PCT/JP2011/072296, Oct. 25, 2011.
International Search Report for Corresponding International Application No. PCT/JP2011/073974, Dec. 20, 2011.
International Search Report for Corresponding International Application No. PCT/JP2011/070197, Oct. 11, 2011.
Office Action issued Aug. 5, 2014, in corresponding Japanese Patent Application No. 2012-538604 (with English-language Translation).
Office Action issued on Jul. 17, 2014, in U.S. Appl. No. 13/866,093, filed Apr. 19, 2013.
Office Action issued on Dec. 2, 2014 in the corresponding Japanese Patent Application No. 2012-538604 (with English Translation).
Office Action issued Mar. 3, 2015, in Japanese Patent Application No. 2012-539740 (w/ English translation).
Office Action issued Aug. 26, 2014, in Japanese Patent Application No. 2012-537652 (w/ English translation).
Office Action mailed May 7, 2015, in co-pending U.S. Appl. No. 14/640,882.
Office Action issued May 12, 2015, in Taiwan Patent Application No. 100137128 filed Oct. 13, 2011 (w/ English translation).
Office Action issued May 21, 2015, in Taiwan Patent Application No. 100138099 filed Oct. 20, 2011 (w/ English translation).
Office Action mailed Jun. 16, 2015, in related U.S. Appl. No. 14/640,882.
Omnova Solutions Inc., PolyFox PF-636, PF-6320 & PF-6520, [online], Jun. 2009.
Japanese Office Action mailed Aug. 25, 2015, in Japanese Patent Application No. 2012-539741 with English Translation thereof.

* cited by examiner

RESIST PATTERN-FORMING METHOD, AND RADIATION-SENSITIVE RESIN COMPOSITION

CROSS-REFERENCE TO RELATED APPLICATIONS

The present application is a continuation application of the U.S. patent application Ser. No. 13/861,416 filed Apr. 12, 2013, which in turn is a continuation application of International Application No. PCT/JP2011/070197, filed Sep. 5, 2011, which claims priority to Japanese Patent Application No. 2010-233027, filed Oct. 15, 2010 and to Japanese Patent Application No. 2011-066669, filed Mar. 24, 2011. The contents of these applications are incorporated herein by reference in their entirety.

BACKGROUND OF THE INVENTION

1. Field of the Invention

The present invention relates to a resist pattern-forming method, and a radiation-sensitive resin composition.

2. Discussion of the Background

Miniaturization of various types of electronic device structures such as semiconductor devices and liquid crystal devices has been accompanied by demands for miniaturization of resist patterns in lithography processes. Although fine resist patterns having a line width of about 90 nm can be formed using, for example, an ArF excimer laser at present, finer resist pattern formation is required in the future.

To meet the demands described above, as a technique for increasing a resolving power using a preexisting apparatus without increasing steps by utilizing characteristic features of a chemically amplified type resist material, a technique in which an organic solvent having polarity lower than that of aqueous alkali solutions is used as a developer solution has been known (see Japanese Unexamined Patent Application, Publication No. 2000-199953). According to such a technique, possible formation of a fine pattern is exploited since attaining a high optical contrast is enabled when an organic solvent is used, contrary to the case in which a trench pattern or a hole pattern is formed using an aqueous alkali solution as a developer solution, accompanied by difficulties in forming a fine resist pattern due to lack in an optical contrast.

SUMMARY OF THE INVENTION

According to one aspect of the present invention, a resist pattern-forming method includes coating a radiation-sensitive resin composition on a substrate to provide a resist film. The resist film is exposed. The exposed resist film is developed using a developer solution including no less than 80% by mass of an organic solvent. The radiation-sensitive resin composition includes a polymer, a radiation-sensitive acid generator, and an acid diffusion controller which includes a compound having an amide group. The polymer has a weight average molecular weight in terms of the polystyrene equivalent of greater than 6,000 and includes a first structural unit that includes an acid-labile group, and less than 5 mol % or 0 mol % of a second structural unit that includes a hydroxyl group.

According to another aspect of the present invention, a radiation-sensitive resin composition includes a polymer, a radiation-sensitive acid generator, and an acid diffusion controller which includes a compound having an amide group. The polymer has a weight average molecular weight in terms of the polystyrene equivalent of greater than 6,000 and includes a first structural unit that includes an acid-labile group, and less than 5 mol % or 0 mol % of a second structural unit that includes a hydroxyl group. The radiation-sensitive resin composition is for use in a resist pattern-forming method including using a developer solution including no less than 80% by mass of an organic solvent.

DESCRIPTION OF THE EMBODIMENTS

According to the embodiment of the present invention made for solving the foregoing problems, a resist pattern-forming method includes:

(1) a resist film-forming step of coating a radiation-sensitive resin composition on a substrate;

(2) an exposure step; and (3) a development step carried out using a developer solution containing no less than 80% by mass of an organic solvent, in which the radiation-sensitive resin composition contains:

(A) a polymer which has a weight average molecular weight in terms of the polystyrene equivalent of greater than 6,000, and has a structural unit (I) (may be also referred to as "first structural unit") that includes an acid-labile group, and less than 5 mol % or 0 mol % of a structural unit (may be also referred to as "second structural unit") that includes a hydroxyl group (hereinafter, may be also referred to as "polymer (A)"); and (B) a radiation-sensitive acid generator (hereinafter, may be also referred to as "acid generator (B)").

According to the resist pattern-forming method of the embodiment of the present invention, a resist pattern can be formed owing to an action of an acid generated from the acid generator (B) upon exposure to allow the acid-labile group of the polymer (A) to be dissociated, thereby generating a polar group such as a carboxyl group to make the polymer (A) hardly soluble in a developer solution containing no less than a certain proportion of an organic solvent. When a polymer having a weight average molecular weight in terms of the polystyrene equivalent greater than the above certain value, and having a proportion of the structural unit that includes a hydroxyl group of less than the above value is used as the polymer (A), the radiation-sensitive resin composition has superior resolution, and the resist pattern-forming method enables film loss of the resist film after the pattern formation to be prevented, and additionally enables a pattern that is superior in CDU and MEEF to be formed.

Although the reasons for enabling film loss of the resist film to be prevented, and enabling the foregoing lithography characteristics to be improved by constituting as described above in the resist pattern-forming method have not been necessarily clear, for example the following reason may be envisaged. It is considered that interactions between carboxyl groups, which are produced during exposure, with one another, and/or between the carboxyl group and a hydroxyl group in the polymer (A) account for the film loss, and the interactions are believed to be structurally inhibited as a result of the molecular weight of the polymer (A) and the proportion of the structural unit that includes a hydroxyl group included falling within the above range, and the like. In addition, when the molecular weight of the polymer (A) is greater than the certain value, the polymer (A) can be hardly soluble in the developer solution even if a low exposure dose is employed to decrease production of the carboxyl groups, thereby enabling pattern formation. Therefore, interactions between the carboxyl groups with one another can be consequently decreased, and thus film loss is also believed to be prevented.

Furthermore, when the molecular weight of the polymer (A) and the proportion of the structural unit that includes a hydroxyl group included falls within the above range, it is believed that the difference resulting from the exposure, i.e., depending on being exposed or unexposed, increases to improve the contrast, whereby a pattern that is superior in CDU and the like can be obtained. Accordingly, in the resist pattern-forming method in which development is carried out using a developer solution containing an organic solvent, film loss of the resist film is prevented by using the radiation-sensitive resin composition containing the polymer that includes the above-specified structure, thereby enabling a resist pattern that is superior in CDU, MEEF to be formed.

The structural unit that includes the acid-labile group is preferably represented by the following formula (1):

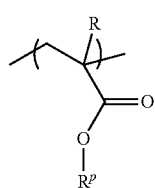

(1)

wherein, in the formula (1), R represents a hydrogen atom, a fluorine atom, a methyl group or a trifluoromethyl group; and $R^P$ represents an acid-labile group represented by the following formula (i):

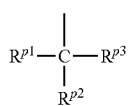

(i)

wherein, in the formula (i), $R^{P1}$ to $R^{P3}$ each independently represent an alkyl group having 1 to 4 carbon atoms or an alicyclic hydrocarbon group having 4 to 9 carbon atoms, or at least two of $R^{P1}$ to $R^{P3}$ taken together represent a divalent alicyclic hydrocarbon group having 4 to 9 carbon atoms together with the carbon atom to which $R^{P1}$ to $R^{P3}$ bond.

When the acid-labile group has comparatively few carbon atoms as in the above structure, a decrease in the molecular weight of the polymer (A) after pattern formation can be inhibited, and as a result, film loss after pattern formation can be further prevented. In addition, when the acid-labile group has the foregoing properties, substances derived from the acid-labile group dissociated scarcely remain in the resist film. Consequently, diffusion of the acid generated from the acid generator (B) is inhibited, whereby a pattern that is superior in CDU, MEEF and the like can be formed. Also, resolution of the radiation-sensitive resin composition containing such a polymer (A) is further improved.

It is preferred that: $R^{P1}$, $R^{P2}$ and $R^{P3}$ in the above formula (i) each independently represent an alkyl group having 1 to 4 carbon atoms; or $R^{P1}$ represents an alkyl group having 1 to 4 carbon atoms, and $R^{P2}$ and $R^{P3}$ taken together represent a divalent alicyclic hydrocarbon group having 4 to 9 carbon atoms together with the carbon atom to which $R^{P2}$ and $R^{P3}$ bond. When the acid-labile group of the polymer (A) has the above-specified structure, an alteration of the molecular structure of the polymer (A) resulting from the pattern formation can be further suppressed, and the acid-labile group becomes more likely to be dissociated. Therefore, film loss can be further prevented, and formation of a pattern that is superior in CDU, MEEF and the like is enabled. Moreover, resolution of the radiation-sensitive resin composition containing such a polymer (A) also can be further improved.

The structural unit (I-1) is preferably included in the structural unit (I) included in the polymer (A) in an amount of no less than 60 mol % and no greater than 95 mol %. When the structural unit (I-1) is included in the structural unit (I) included in the polymer (A) in an amount of no less than 60 mol % and no greater than 95 mol %, film loss after pattern formation of the resist film can be effectively prevented, and additionally formation of a pattern that is superior in CDU and MEEF is enabled.

The organic solvent is preferably at least one organic solvent selected from the group consisting of an alcohol solvent, an ether solvent, a ketone solvent, an amide solvent, an ester solvent and a hydrocarbon solvent. Since the difference of a solubility of the polymer (A) resulting from the exposure, i.e., depending on being exposed or unexposed, can be increased by using the above-specified organic solvent, a contrast of the pattern is improved, and formation of a pattern further superior in CDU and MEEF is enabled.

The radiation-sensitive resin composition of the embodiment of the present invention is a radiation-sensitive resin composition for use in a resist pattern-forming method in which a developer solution containing no less than 80% by mass of an organic solvent is used, the radiation-sensitive resin composition containing: (A) a polymer having a weight average molecular weight in terms of the polystyrene equivalent of greater than 6,000, having a structural unit that includes an acid-labile group, and having less than 5 mol % or 0 mol % of a structural unit that includes a hydroxyl group, and (B) a radiation-sensitive acid generator.

The radiation-sensitive resin composition is superior in the resolution, and according to the radiation-sensitive resin composition, and by using the resist pattern-forming method, film loss after pattern formation of the resist film can be prevented, and a resist pattern that is superior in CDU and MEEF can be obtained.

According to the resist pattern-forming method of the embodiment of the present invention, film loss after pattern formation of a resist film can be prevented, and formation of a resist pattern that is superior in CDU and MEEF is enabled. In addition, the radiation-sensitive resin composition of the embodiment of the present invention for use in the resist pattern-forming method achieves sufficient resolution. The embodiments will now be described in detail.

Resist Pattern-Forming Method

An embodiment of the present invention provides a resist pattern-forming method including: (1) a resist film-forming step of coating a radiation-sensitive resin composition on a substrate; (2) an exposure step; and (3) a development step carried out using a developer solution containing no less than 80% by mass of an organic solvent, the radiation-sensitive resin composition containing: (A) a polymer having a weight average molecular weight in terms of the polystyrene equivalent of greater than 6,000, having a structural unit that includes an acid-labile group, and having less than 5 mol % or 0 mol % of a structural unit that includes a hydroxyl group; and (B) a radiation-sensitive acid generator. Hereinafter, each step will be described in detail.

Step (1)

In this step, the radiation-sensitive resin composition of the embodiment of the present invention is coated on a substrate to provide a resist film. As the substrate, for example, conventionally well-known substrates such as a silicon wafer and a wafer coated with aluminum can be used. In addition, organic or inorganic antireflective films disclosed in, for example, Japanese Examined Patent Application, Publication No. H06-12452, Japanese Unexamined Patent Application, Publication No. S59-93448, and the like may be provided on the substrate.

A coating method is exemplified by spin-coating, cast coating, roll coating, and the like. It is to be noted that the film thickness of the resist film provided is typically 0.01 μm to 1 μm, and preferably 0.01 μm to 0.5 μm.

After coating the radiation-sensitive resin composition, a solvent in the coating film may be volatilized as needed by prebaking (PB). According to heating conditions of PB, the temperature may be appropriately selected depending on the formulation of the radiation-sensitive resin composition, and is typically about 30° C. to 200° C. and preferably 50° C. to 150° C.

A protective film as disclosed in Japanese Patent Application Publication No. H05-188598 or the like may be provided on the resist layer so that the resist film is not affected by basic impurities and the like contained in the environmental atmosphere. Furthermore, in order to prevent outflow of the acid generating agent and the like from the resist layer, a liquid immersion lithography protective film as disclosed in Japanese Patent Application Publication No. 2005-352384 or the like may be provided on the resist layer. These techniques may be used in combination.

Step (2)

In this step, the resist film provided in the step (1) is exposed at a desired region by carrying out reduction projection through a mask having a specific pattern, and as needed an immersion liquid. For example, an isolated trench (iso-trench) pattern can be formed by carrying out reduced projection exposure at a desired region through a mask of an isolated line (iso-line) pattern. Similarly, a hole pattern can be formed by carrying out reduced projection exposure through a dot pattern mask. Also, the exposure may be carried out at least twice depending on the desired pattern and the mask pattern. When the exposure is carried out at least twice, the exposure is preferably carried out continuously. When the exposure is carried out a plurality of times, for example, first reduced projection exposure is carried out through a line-and-space pattern mask at a desired region, and subsequently second reduced projection exposure is carried out such that lines cross over light-exposed sites subjected to the first exposure. The first light-exposed sites are preferably orthogonal to the second light-exposed sites. Due to being orthogonal with each other, a circular contact hole pattern can be easily formed at light-unexposed sites surrounded by light-exposed sites. It is to be noted that examples of the immersion liquid for use in the exposure include water, a fluorine-containing inert liquid, and the like. It is preferred that the immersion liquid be transparent to the exposure wavelength, and has a temperature coefficient of the refractive index as small as possible so that distortion of an optical image projected onto the film is minimized. When an ArF excimer laser (wavelength: 193 nm) is used as the exposure light source, it is preferred to use water from the viewpoint of availability and ease of handling, in addition to the viewpoints described above.

A radioactive ray used for the exposure is appropriately selected in accordance with the type of the acid generator (B), and is exemplified by an ultraviolet ray, a far ultraviolet ray, an X-ray, a charged particle ray, and the like. Among these, a far ultraviolet ray typified by an ArF excimer laser (wavelength: 193 nm) or a KrF excimer laser (wavelength: 248 nm) is preferred, and an ArF excimer laser is more preferred. The exposure conditions such as an exposure dose are appropriately selected in accordance with the formulation, and type of additives etc. of the composition. The resist pattern-forming method of the embodiment of the present invention may include a plurality of the exposure steps, and light sources employed in the exposure carried out a plurality of times may be identical or different, but an ArF excimer laser beam is preferably used in the first exposure step.

In addition, it is preferred that post-exposure baking (PEB) is carried out after the exposure. When the PEB is carried out, a dissociate reaction of an acid-labile group in the composition can smoothly proceed. According to heating conditions of PEB, the temperature may be typically 30° C. to 200° C., and preferably 50° C. to 170° C.

Step (3)

In this step, after the exposure in the step (2), development is carried out using a negative developer solution containing no less than 80% by mass of an organic solvent to form a pattern. The negative developer solution as referred to means a developer solution that selectively dissolve and remove poorly light-exposed sites and light-unexposed sites. The organic solvent contained in the negative developer solution is preferably at least one selected from the group consisting of an alcohol solvent, an ether solvent, a ketone organic solvent, an amide solvent, an ester organic solvent and a hydrocarbon solvent.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

partially etherified polyhydric alcohol solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether, and the like.

Examples of the ether solvent include diethyl ether, dipropyl ether, dibutyl ether, tetrahydrofuran, dioxane, diphenyl ether, methoxybenzene, and the like.

Examples of the ketone solvent include acetone, methyl ethyl ketone, methyl n-propyl ketone, methyl n-butyl ketone, diethyl ketone, methyl iso-butyl ketone, methyl n-amyl ketone, ethyl n-butyl ketone, methyl n-hexyl ketone, di-iso-butyl ketone, trimethylnonanone, cyclopentanone, cyclohexanone, cycloheptanone, cyclooctanone, methylcyclohexanone, 2,4-pentanedione, acetonyl acetone, acetophenone, and the like.

Examples of the amide solvent include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester solvent include diethyl carbonate, propylene carbonate, methyl acetate, ethyl acetate, γ-butyrolactone, γ-valerolactone, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon solvent include:

aliphatic hydrocarbon solvents such as n-pentane, iso-pentane, n-hexane, iso-hexane, n-heptane, iso-heptane, 2,2,4-trimethyl pentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, i-propylbenzene, diethylbenzene, i-butylbenzene, triethylbenzene, di-i-propylbenzene and n-amylnaphthalene, and the like.

Of these, n-butyl acetate, isopropyl acetate, n-amyl acetate, methyl ethyl ketone, methyl-n-butyl ketone, and methyl-n-amyl ketone are preferred. These organic solvents may be used either alone, or in combination of two or more thereof.

The content of the organic solvent in the developer solution is no less than 80% by mass. When the content of the organic solvent in the developer solution is no less than 80% by mass, a contrast of the pattern resulting from the exposure, i.e., depending on being exposed or unexposed, can be improved, and consequently, a pattern that is superior in development characteristics and lithography characteristics can be formed. It is to be noted that examples of components other than the organic solvent include water, a silicon oil, and the like.

A surfactant may be added to the developer solution in an appropriate amount as needed. As the surfactant, for example, an ionic or nonionic fluorochemical surfactant and/or a silicon surfactant, and the like may be used.

Examples of the development method include a dipping method that immerses the substrate in a container filled with the developer for a given time, a puddle method that allows the developer to be present on the surface of the substrate due to surface tension for a given time, a spraying method that sprays the developer onto the surface of the substrate, a dynamic dispensing method that applies the developer to the substrate that is rotated at a constant speed while scanning with a developer application nozzle at a constant speed, and the like.

In the pattern-formation, it is preferred that a step of rinsing the resist film with a rinse agent be carried out after the development in the step (3). Moreover, also as the rinse agent in the rinsing step, an organic solvent may be used, whereby scum generated can be efficiently washed away. The rinse agent is preferably a hydrocarbon solvent, a ketone solvent, an ester solvent, an alcohol solvent, an amide solvent, or the like. Of these, an alcohol solvent and an ester solvent are preferred, and a monovalent alcohol solvent having 6 to 8 carbon atoms is more preferred. The monovalent alcohol having 6 to 8 carbon atoms is exemplified linear, branched or cyclic monovalent alcohols, and examples thereof include 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, benzyl alcohol, and the like. Of these, 1-hexanol, 2-hexanol, 2-heptanol, and 4-methyl-2-pentanol are preferred.

Each component of the rinse agent may be used either alone, or in combination of two or more thereof. The moisture content in the rinse agent is preferably no greater than 10% by mass, more preferably no greater than 5% by mass, and still more preferably no greater than 3% by mass. When the moisture content is no greater than 10% by mass, favorable development characteristics can be attained. It is to be noted that a surfactant may be added to a rinse agent described later.

Examples of the rinsing method include a spinning method that applies the rinse agent to the substrate that is rotated at a constant speed, a dipping method that immerses the substrate in a container filled with the rinse agent for a given time, a spraying method that sprays the rinse agent onto the surface of the substrate, and the like.

Radiation-Sensitive Resin Composition

The radiation-sensitive resin composition for use in the embodiment of the present invention contains (A) a polymer, and (B) an acid generator, and may further contain optional components within a range not leading to impairment of the effects of the embodiment of the present invention. Hereinafter, each component will be described in detail.

(A) Polymer

The polymer (A) has a weight average molecular weight in terms of the polystyrene equivalent of greater than 6,000, having a structural unit (I) that includes an acid-labile group, and having less than 5 mol % or 0 mol % of a structural unit that includes a hydroxyl group. According to the resist pattern-forming method, the film loss after pattern formation of the resultant resist film can be prevented, and formation of a pattern that is superior in CDU and the like is enabled when the polymer (A) has the above-specified properties.

Although the reasons for enabling film loss after pattern formation of the resist film to be prevented, and enabling the foregoing lithography characteristics of the radiation-sensitive resin composition containing the polymer (A) to be improved, due to the polymer (A) having the characteristics described above in the resist pattern-forming method have not been necessarily clear. However, it is considered, for example, that interactions between carboxyl groups, which are produced during exposure, with one another, and/or between the carboxyl group and a hydroxyl group in the polymer (A) may be one cause of the film loss, and the interactions are believed to be structurally inhibited as a result of the molecular weight of the polymer (A) and the proportion of the structural unit that includes a hydroxyl group included falling within the above range, and the like. Also, with regard to lithography performances evaluated in accordance with CDU, etc., as an index, when the molecular weight of the polymer (A) and the proportion of the structural unit that includes a hydroxyl group included falls within the above range, it is believed that the difference resulting from the exposure, i.e., depending on being exposed or unexposed, increases to improve the contrast, in addition to achieving the effect of preventing the film loss.

On the other hand, since the polymer (A) has a molecular weight greater than a predetermined value, and low solubility in a developer solution containing an organic solvent, a pattern can be formed at a lower exposure dose. Thus, the amount of the carboxyl group generated in pattern formation can be further reduced, and interactions between carboxyl groups can be decreased, whereby the film loss can be further prevented.

The polymer (A) essentially has a weight average molecular weight in terms of the polystyrene equivalent (hereinafter, may be also referred to as "Mw") of greater than 6,000. When the Mw of the polymer (A) is greater than 6,000, film loss after pattern formation of the resultant resist film can be prevented, along with improvement of lithography characteristics such as CDU, as a synergistic effect with the proportion of the structural unit that includes a hydroxyl group included being less than the predetermined value as described later. The Mw of the polymer (A) is typically greater than 6,000 and no greater than 100,000, preferably greater than 6,000 and no greater than 30,000, and more preferably greater than 8,000 and no greater than 20,000. When the Mw of the polymer (A) is no greater than 6,000, marked film loss of the resultant resist pattern, and reduction of etching resistance occur, as well as remarkable deterioration of lithography characteristics such as CDU tend to occur. Furthermore, when the Mw is greater than 100,000, a difference of solubility of the polymer (A) resulting from the exposure, i.e., depending on being exposed or unexposed becomes so small that lithography characteristic may be deteriorated.

The number average molecular weight in terms of the polystyrene equivalent (hereinafter, may be also referred to as "Mn") of the polymer (A) is 2,000 to 60,000, preferably 3,000 to 40,000, and particularly preferably 4,000 to 20,000.

The ratio (Mw/Mn) of the weight average molecular weight (Mw) to the number average molecular weight (Mn) of the polymer (A) is typically 1 to 3, and preferably 1 to 2. It is to be noted that values of the Mw and the Mn may be determined by measurement on gel permeation chromatography (GPC) using polystyrene as a standard.

The content of the low molecular weight components in the polymer (A) is preferably no greater than 0.15% by mass, more preferably no greater than 0.07% by mass, and still more preferably no greater than 0.04% by mass. When the content of the low molecular weight components falls within the above range, interactions between carboxyl groups, etc., generated after pattern formation of the resultant resist film are less likely to occur, whereby the film loss can be further prevented. It is to be noted that the "low molecular weight components" mean components having a molecular weight of less than 1,000, and the content thereof may be determined by high performance liquid chromatography (HPLC).

Structural Unit (I) that Includes Acid-Labile Group

The polymer (A) has a structural unit that includes an acid-labile group (hereinafter, may be also referred to as "structural unit (I)"). The term "acid-labile group" as referred to herein means a group that substitutes for a hydrogen atom in a polar functional group such as a carboxyl group, and is dissociated by an action of an acid generated from the acid generator (B) upon exposure. Since the polymer (A) has the structural unit that includes an acid-labile group, the number of the polar functional groups such as a carboxyl group increases upon exposure, leading to an increase in polarity as a whole of the polymer, and thus the solubility in a developer solution containing an organic solvent decreases, whereby a favorable resist pattern can be formed.

The structural unit (I) is not particularly limited as long as an acid-labile group is included in the structural unit. The number of the acid-labile group in the structural unit (I) may be one, or two or more. In addition, the position of the acid-labile group in the structural unit (I) is also not particularly limited as long as it substitutes for a hydrogen atom in the polar functional group. The acid-labile group is not particularly limited as long as it has the acid-dissociating property described above.

The acid-labile group preferably has an alicyclic hydrocarbon group. When the acid-labile group has an alicyclic hydrocarbon group, the acid-labile group is likely to be dissociated, and as a result, lithography characteristics of the resultant resist film are further improved.

Specific example of preferred structural unit (I) is the structural unit represented by the above formula (1) (hereinafter, may be also referred to as "structural unit (I-1)").

Structural Unit (I-1)

The structural unit (I-1) is represented by the above formula (1). Since the number of carbon atoms constituting the acid-labile group of the structural unit (I-1) is relatively small, a decrease in the molecular weight of the polymer (A) after pattern formation can be suppressed, and as a result, film loss after pattern formation can be further prevented. In addition, for similar reasons to those described above, substances derived from the acid-labile group dissociated scarcely remain in the resist film, and consequently, diffusion of the acid generated from the acid generator (B) is inhibited, whereby the lithography characteristics such as CDU are further improved. In addition, since a monomer that gives the structural unit (I-1) is superior in copolymerizability, the content of the acid-labile group in the polymer (A) can be conveniently adjusted to a desired value. Furthermore, since the monomer that gives the structural unit (I-1) can be readily synthesized, the acid-labile group of the polymer (A) having a desired structure can be conveniently provided.

In the above formula (1), R represents a hydrogen atom, a fluorine atom, a methyl group or a trifluoromethyl group; and $R^p$ is represented by the above formula (i). In the above formula (i), $R^{P1}$ to $R^{P3}$ each independently represent an alkyl group having 1 to 4 carbon atoms or an alicyclic hydrocarbon group having 4 to 9 carbon atoms, or at least two of $R^{P1}$ to $R^{P3}$ taken together represent a divalent alicyclic hydrocarbon group having 4 to 9 carbon atoms together with the carbon atom to which the at least two of $R^{P1}$ to $R^{P3}$ bond.

Examples of the alkyl group having 1 to 4 carbon atoms represented by $R^{P1}$ to $R^{P3}$ in the above formula (i) include a methyl group, an ethyl group, a n-propyl group, an i-propyl group, a n-butyl group, a 2-methylpropyl group, a 1-methylpropyl group, a t-butyl group, and the like.

Examples of the monovalent alicyclic hydrocarbon group having 4 to 9 carbon atoms represented by $R^{P1}$ to $R^{P3}$ in the above formula (i) include:

polycyclic alicyclic groups having a bridged skeleton such as a norbornane skeleton;

monocyclic alicyclic groups having a cycloalkane skeleton such as cyclopentane and cyclohexane;

hydrocarbon groups having any of these monocyclic or polycyclic alicyclic groups; and the like. Moreover, these groups are unsubstituted or substituted with, for example, at least one linear, branched or cyclic alkyl group having 1 to 10 carbon atoms.

The divalent alicyclic hydrocarbon group taken together represented by at least two of $R^{P1}$ to $R^{P3}$ together with the carbon atom to which the at least two of $R^{P1}$ to $R^{P3}$ bond in the above formula (i) is exemplified by a group derived by removing one hydrogen atom from the monovalent group exemplified as the monovalent alicyclic hydrocarbon group having 4 to 9 carbon atoms represented by $R^{p1}$ to $R^{p3}$ in the above formula (i).

Among combinations of the $R^{p1}$ to $R^{p30}$, it is further preferred that in the above formula (i): $R^{p1}$, $R^{p2}$ and $R^{p3}$ represent an alkyl group having 1 to 4 carbon atoms; or $R^{p1}$ represents an alkyl group having 1 to 4 carbon atoms, and $R^{p2}$ and $R^{p3}$ taken together represent an alicyclic hydrocarbon group such as a divalent cycloalkane skeleton having 4 to 9 carbon atoms together with the carbon atom to which $R^{p2}$ and $R^{p3}$ bond.

When the acid-labile group that includes $R^{p1}$ to $R^{p3}$ has the aforementioned structure, an alteration of the molecular structure of the polymer (A) after the pattern formation can be suppressed, and the acid-labile group is more likely to be dissociated; therefore, the film loss can be further prevented, and lithography characteristics evaluated in accordance with MEEF, etc., as an index, can be further improved.

Examples of preferred structural unit (I-1) include structural units represented by the following formulae (1-1) to (1-4).

(1-1)
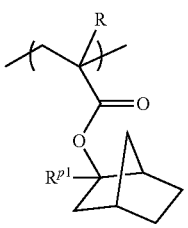

(1-2)
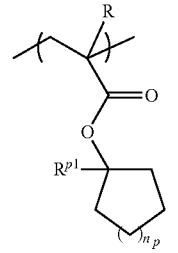

(1-3)
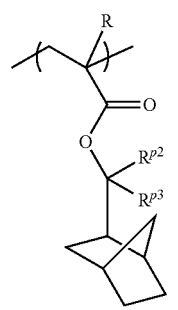

(1-4)
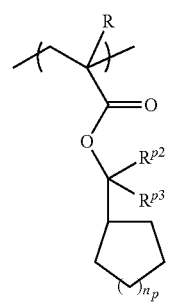

In the formulae (1-1) to (1-4), R is as defined in the above formula (1); $R^{p1}$, $R^{p2}$ and $R^{p3}$ are as defined in the above formula (i); and $n_p$ is an integer of 1 to 4.

Specific examples of the structural units represented by the above formulae (1) or (1-1) to (1-4) include structural units represented by the following formulae.

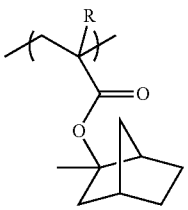 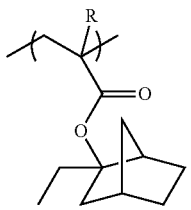

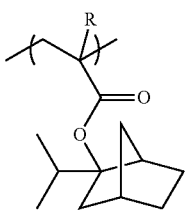 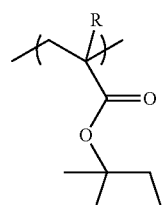

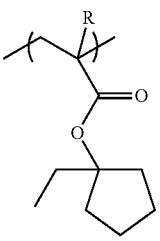 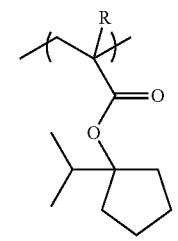

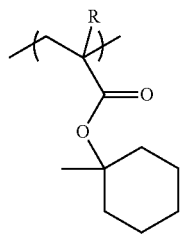 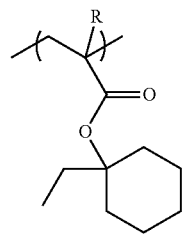

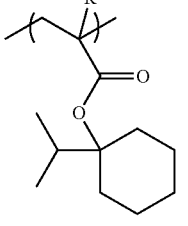 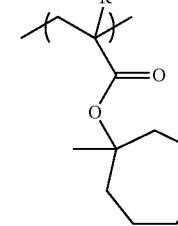

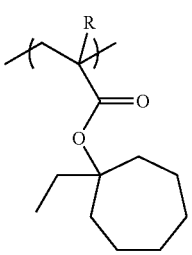 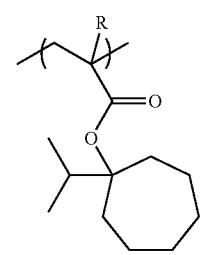

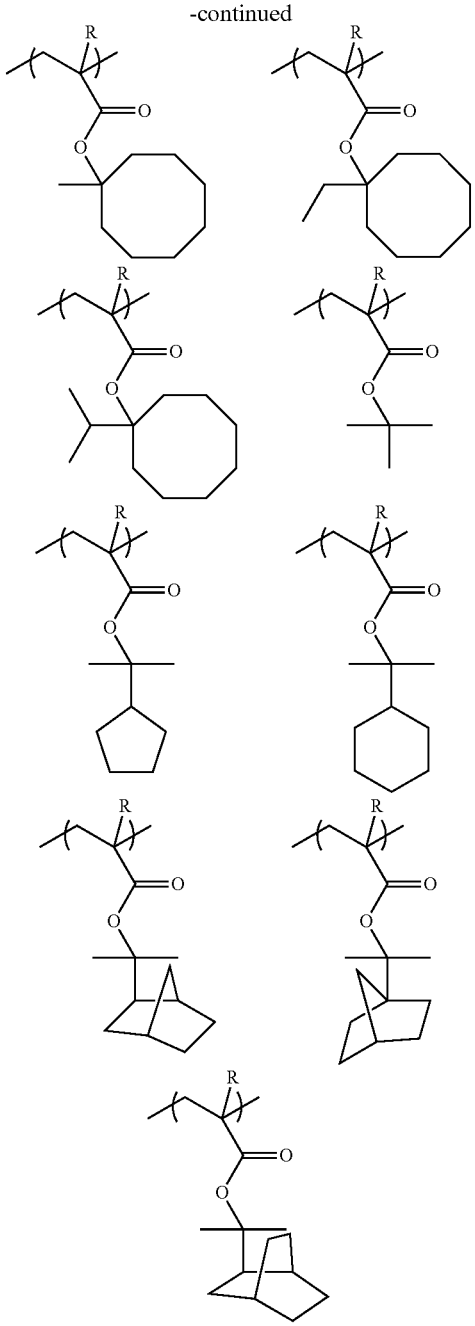

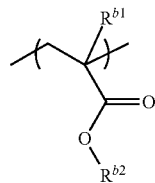

In the above formula (2), $R^{b1}$ represents a hydrogen atom or a methyl group; and $R^{b2}$ represents a group that includes a monovalent alicyclic group having 10 to 20 carbon atoms. In the alicyclic group, a part or all of hydrogen atoms are unsubstituted or substituted with an alkyl group having 1 to 4 carbon atoms.

The monovalent alicyclic group having 10 to 20 carbon atoms represented by $R^{b2}$ is exemplified by bridged alicyclic groups such as a tricyclodecanyl group, a tetracyclododecanyl group and an adamantyl group, and the like.

Examples of the structural unit (I-2) include structural units represented by the following formulae, and the like.

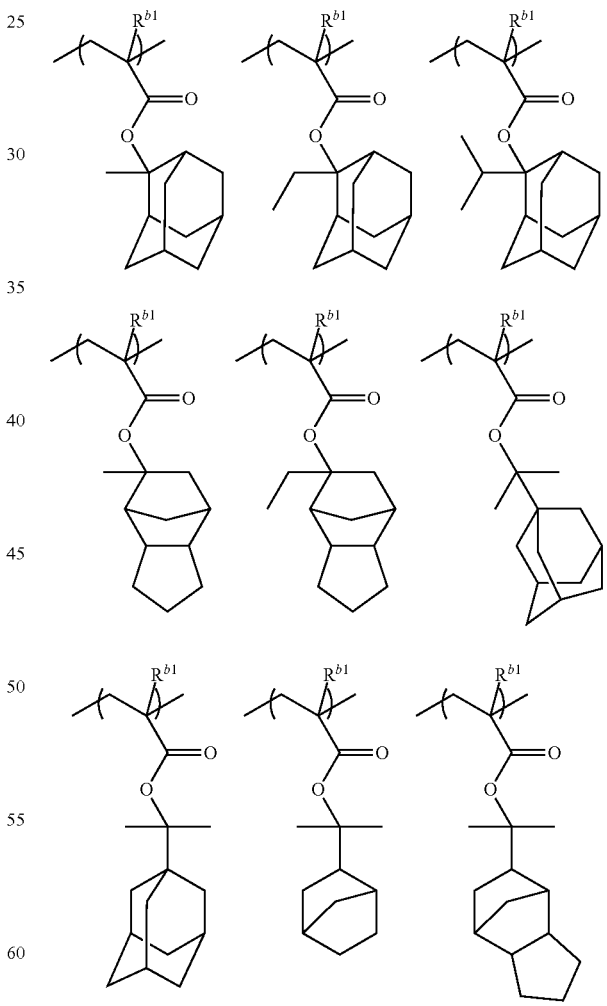

In the above formulae, $R^{b1}$ is as defined in the above formula (2).

The lower limit of the proportion of the structural unit (I) included in the polymer (A) is preferably 5 mol %, more In the formulae, R is as defined in the above formula (1).

Among these specific examples of the structural units represented by the above formula (1) and the above formulae (1-1) to (1-4), structural units having as an acid-labile group a norbornyl group or a cycloalkyl group substituted with an alkyl group at position 1 are preferred, and of these, structural units having as an acid-labile group a cyclopentyl group or a cyclohexyl group substituted with an alkyl group at position 1, and a t-butyl group are more preferred.

Structural Unit (I-2)

The structural unit (I) may have in addition to the structural unit (I-1), for example, a structural unit represented by the following formula (2) (hereinafter, may be also referred to as "structural unit (I-2)") for the purpose of adjusting the resolution, solubility at light-unexposed sites, and the like.

preferably 10 mol %, still more preferably 20 mol %, particularly preferably 30 mol %, and most preferably 40 mol %. On the other hand, the upper limit of the proportion of the structural unit (I) included is preferably 90 mol %, more preferably 80 mol %, still more preferably 70 mol %, and particularly preferably 60 mol %. When the proportion of the structural unit (I) included is less than the lower limit, sensitivity of the radiation-sensitive resin composition obtained may be deteriorated. To the contrary, when the proportion of the structural unit (I) included is less than the upper limit, pattern formability may be deteriorated. The polymer (A) may have one type, or two or more types of the structural unit (I).

The proportion of the structural unit (I-1) in the structural unit (I) in the polymer (A) is typically 60 to 95 mol %, preferably 65 to 95 mol %, and more preferably 70 to 90 mol %. When the proportion of the structural unit (I-1) falls within the above range, favorable solubility of the resultant resist film in an organic solvent is attained, and thus pattern formation with high resolution and prevention of film loss after pattern formation can be both achieved.

Structural Unit that Includes Hydroxyl Group (II)

The polymer (A) may have a structural unit that includes a hydroxyl group (hereinafter, may be also referred to as "structural unit (II)"), and the content is essentially less than 5 mol %. When the content of the structural unit (II) is less than 5 mol % or 0 mol %, film loss after pattern formation of the resultant resist film can be prevented by a synergistic effect in combination with the effect achieved by the weight average molecular weight in terms of styrene of the polymer (A) exceeding the predetermined value. Also, in addition to the prevention of film loss, an alteration of the polarity of the polymer (A) can be further enhanced after dissociation of the acid-labile group of the polymer (A); therefore, lithography characteristics such as CDU can be consequently improved. The content of the structural unit (II) in the polymer (A) is preferably no greater than 4 mol %, more preferably 2 mol %, and particularly preferably 0 mol %, thus in other words, the polymer (A) preferably has no structural unit (II).

The structural unit (II) is not particularly limited as long as a hydroxyl group is included in its structural unit. The number of the hydroxyl group in the structural unit (II) may be one, or two or more, and in light of enhancement of an alteration of the polarity of the polymer (A) after pattern formation, the number of the hydroxyl group is preferably the smaller, more preferably no greater than 2, and particularly preferably 1. Also, the position of the hydroxyl group in the structural unit (II) is not particularly limited. Specific examples of the structural unit (II) include structural units represented by the following formulae.

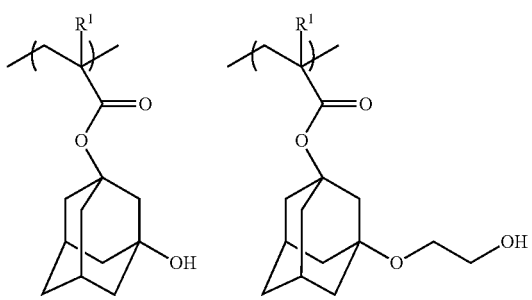

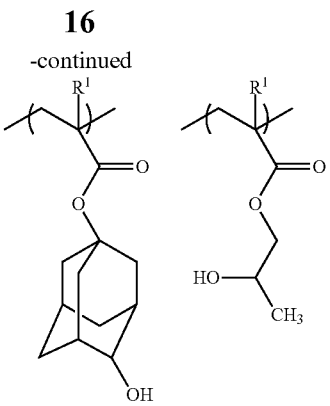

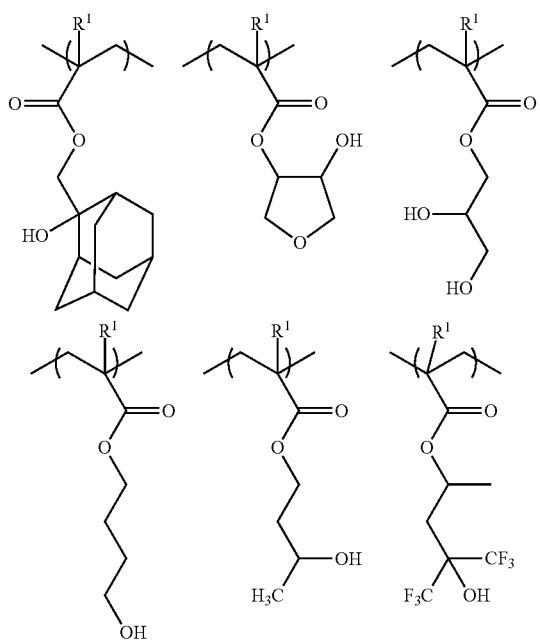

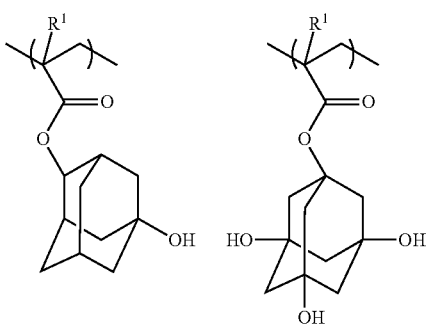

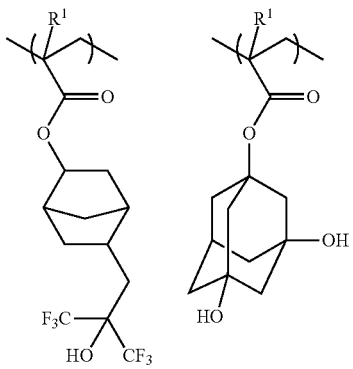

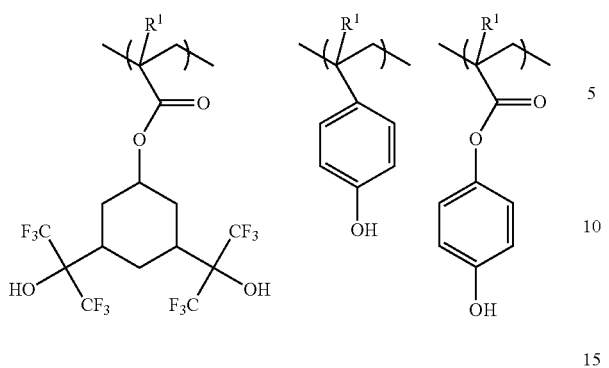

In the above formula, R¹ represents a hydrogen atom, a fluorine atom, a methyl group or a trifluoromethyl group.

Structural Unit (III) that Includes Lactone-Containing Group or Cyclic Carbonate-Containing Group The polymer (A) preferably has a structural unit (hereinafter, may be also referred to as "structural unit (III)") that includes a lactone-containing group or a cyclic carbonate-containing group. Adhesiveness of the resist film to a substrate can be improved when the polymer (A) has the structural unit (III). In addition, solubility of the resist film in a developer solution can be improved. The "lactone-containing group" as herein referred to indicates a cyclic group having one ring that includes a bond represented by —O—C(O)— (i.e., lactone ring). Further, the "cyclic carbonate-containing group" indicates a cyclic group having one ring that includes a bond represented by —O—C(O)—O— (i.e., cyclic carbonate ring). The lactone ring or the cyclic carbonate ring is counted as a first ring, and when only the lactone ring or the cyclic carbonate ring is included, the group is referred to as a "monocyclic group", whereas when other ring structure is further included, the group is referred to as a "polycyclic group", irrespective of its structure.

Examples of the structural unit (III) include structural units represented by the following formulae, and the like.

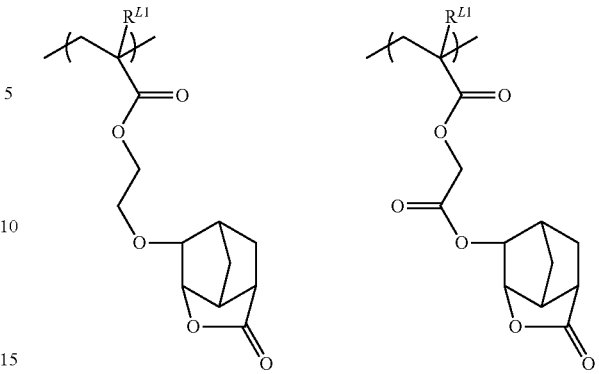

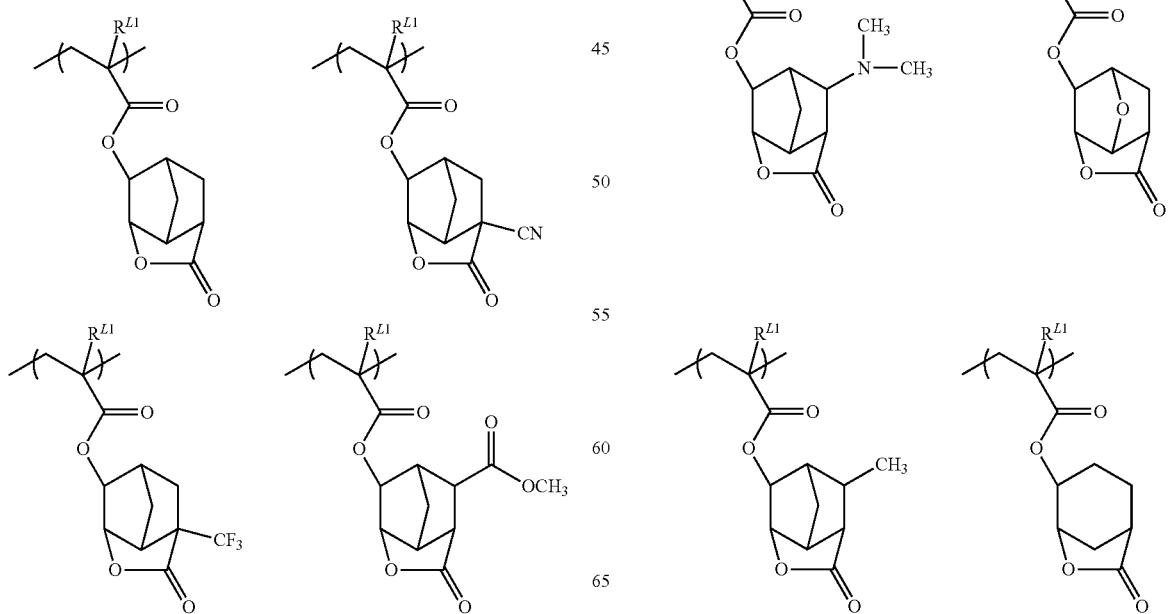

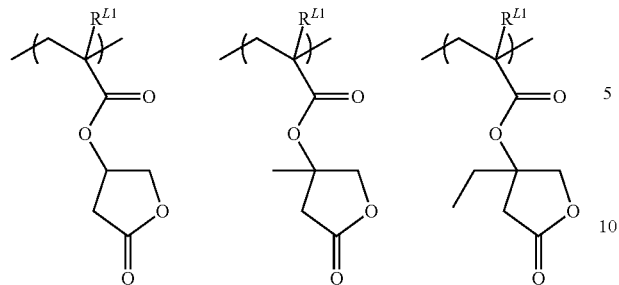
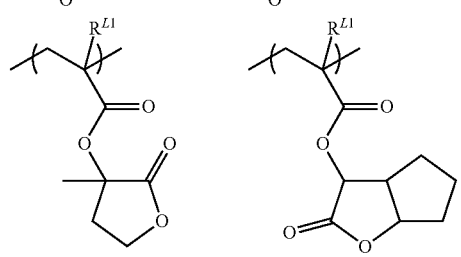
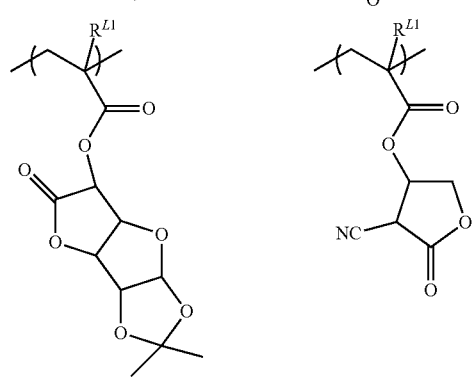
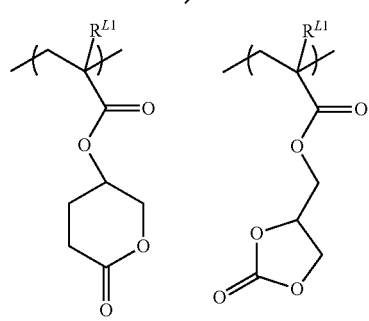
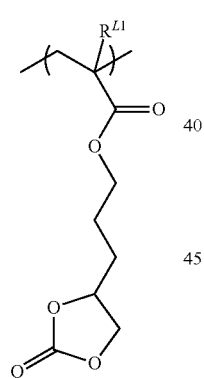
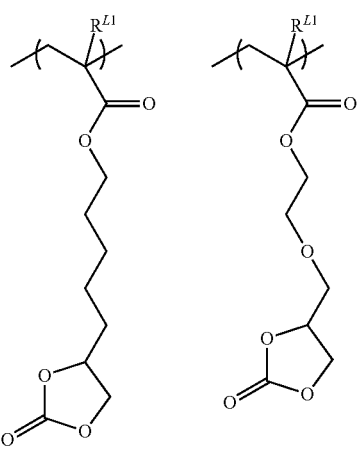
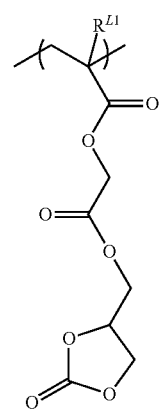
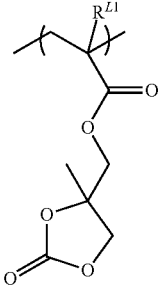
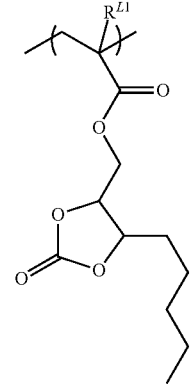
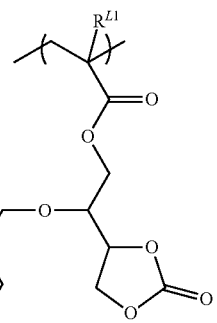
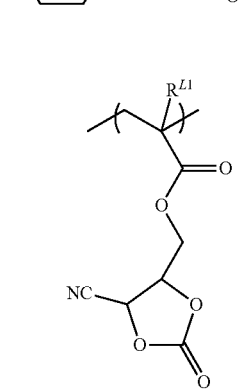
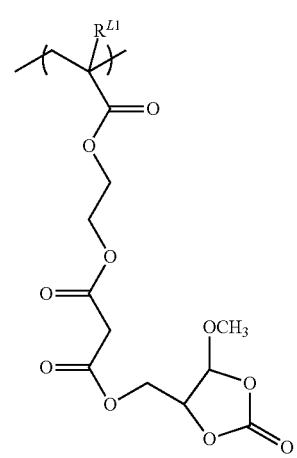

-continued

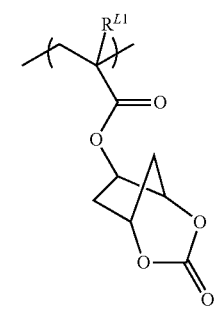 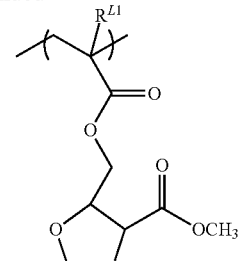

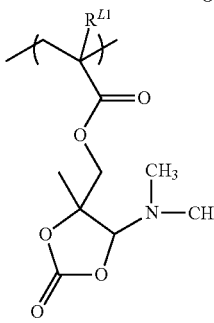 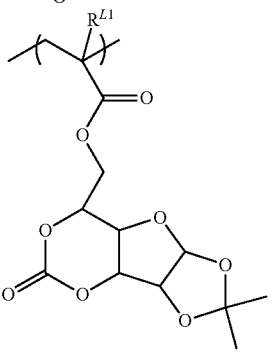

In the above formulae, $R^{L1}$ represents a hydrogen atom, a fluorine atom, a methyl group or a trifluoromethyl group.

It is preferred that the structural unit (III) has no polar group other than a lactone group, a cyclic carbonate group and an ester group, or has no functional group that generates a polar group by an action of the acid generator (B) upon exposure. The absence of the polar group and/or the functional group that generates a polar group can lead to an increase of a difference resulting from the exposure, i.e., depending on being exposed or unexposed the difference of polarity of the polymer (A); therefore, lithography characteristics such as CDU can be further improved. Examples of the polar group include a cyano group, an alkoxy group, an amino group, a dialkylamino group, an amide group, and the like. In addition, examples of the functional group that generates a polar group by an action of the acid generator (B) include an acetal group, a ketal group, a carbamate group, and the like.

Examples of the monomer that yields that structural unit (III) include monomers represented by the following formula (L-1), and the like.

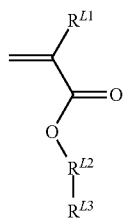
(L-1)

In the above formula (L-1), $R^{L1}$ represents a hydrogen atom, a fluorine atom, a methyl group or a trifluoromethyl group; $R^{L2}$ represents a single bond or a divalent linking group; and $R^{L3}$ represents a monovalent organic group having a lactone structure or a cyclic carbonate structure.

The divalent linking group represented by $R^{L2}$ is exemplified by a divalent linear or branched hydrocarbon group having 1 to 20 carbon atoms, and the like.

Examples of the monovalent organic group having a lactone structure represented by $R^{L3}$ include groups represented by the following formulae (L3-1) to (L3-6), and the like.

Examples of the monovalent organic group having a cyclic carbonate structure represented by $R^{L3}$ include groups represented by the following formulae (L3-7) and (L3-8), and the like.

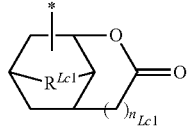
(L3-1)

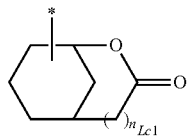
(L3-2)

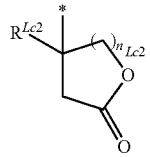
(L3-3)

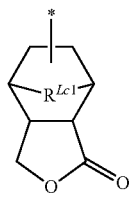
(L3-4)

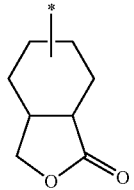
(L3-5)

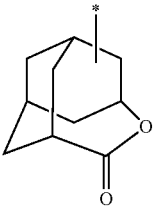
(L3-6)

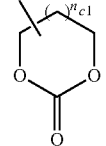
(L3-7)

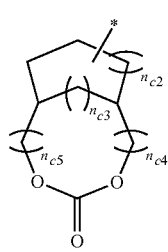

(L3-8)

In the formulae (L3-1) and (L3-4), $R^{Lc1}$ represents an oxygen atom or a methylene group.

In the formula (L3-3), $R^{Lc2}$ represents a hydrogen atom or an alkyl group having 1 to 4 carbon atoms.

In the formulae (L3-1) and (L3-2), $n_{Lc1}$ is 0 or 1.

In the formula (L3-3), $n_{Lc2}$ is an integer of 0 to 3.

In the formula (L3-7), $n_{c1}$ is an integer of 0 to 2.

In the formula (L3-8), $n_{c2}$ to $n_{c5}$ are each independently an integer of 0 to 2, and "*" indicates an atomic bonding that links to $R^{L2}$ in the above formula (L-1).

It is to be noted that groups represented by the formulae (L3-1) to (L3-8) may have a substituent.

Preferable monomers that give the structural unit (III) include, for example, monomers described in paragraph [0043] of PCT International Publication No. 2007/116664, and the like.

In the polymer (A), the proportion of the structural unit (III) included is preferably 30 mol % to 60 mol %. When the content of the structural unit (III) in the polymer (A) falls within the above range, adhesiveness of the resist pattern obtained can be improved.

Other Structural Unit

The polymer (A) may have a structural unit that includes an alicyclic structure (excluding those included in the structural unit (I)), etc., in order to further improve the etching resistance.

The structural unit that includes an alicyclic structure is exemplified by a structural unit represented by the following formula (4), and the like.

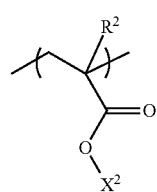

(4)

In the above formula (4), $R^6$ represents a hydrogen atom, a fluorine atom, a methyl group or a trifluoromethyl group; and $X^2$ represents a monovalent alicyclic hydrocarbon group having 4 to 20 carbon atoms.

The monovalent alicyclic hydrocarbon group having 4 to 20 carbon atoms represented by $X^2$ is exemplified by a group derived by removing one hydrogen atom from cyclobutane, cyclopentane, cyclohexane, bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane, tricyclo[3.3.1.1$^{3,7}$]decane or the like. These monovalent alicyclic hydrocarbon groups having 4 to 20 carbon atoms may have a substituent. Examples of the substituent include linear, branched or cyclic alkyl group having 1 to 4 carbon atoms such as a methyl group, an ethyl group, a n-propyl group, an i-propyl group, a n-butyl group, a 2-methylpropyl group, a 1-methylpropyl group and a t-butyl group, a hydroxyl group, a cyano group, a hydroxyalkyl group having 1 to 10 carbon atoms, a carboxyl group, an oxygen atom, and the like.

Examples of the monomer that gives the structural unit that includes an alicyclic structure include (meth)acrylic acid-bicyclo[2.2.1]hept-2-yl ester, (meth)acrylic acid-bicyclo[2.2.2]oct-2-yl ester, (meth)acrylic acid-tricyclo[5.2.1.0$^{2,6}$]dec-7-yl ester, (meth)acrylic acid-tricyclo[3.3.1.1$^{3,7}$]dec-1-yl ester, (meth)acrylic acid-tricyclo[3.3.1.1$^{3,7}$]dec-2-yl ester, and the like.

In the polymer (A), each only one type, or two or more types of the structural unit (I), the structural unit (II), the structural unit (III) and the other structural unit may be included. It is to be noted that the polymer (A) preferably does not include a structural unit having an aromatic group. When the polymer (A) includes a structural unit having an aromatic group, a decrease in sensitivity may be caused particularly in the case in which an ArF light source is used, and the shape may be deteriorated further in the case in which development is carried out using a negative developer solution.

Synthesis Method of Polymer (A)

The polymer (A) may be prepared, for example, by polymerizing the monomer that corresponds to each predetermined structural unit in an appropriate solvent using a radical polymerization initiator.

Examples of the radical polymerization initiator include: azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile) and dimethyl 2,2'-azobisisobutyrate; peroxide radical initiators such as benzoylperoxide, t-butylhydroperoxide and cumenehydroperoxide, and the like. Among these, AIBN and dimethyl 2,2'-azobisisobutyrate are preferred. These radical initiators may be used either alone, or as a mixture of two or more thereof.

Examples of solvent for use in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutanes, bromohexanes, dichloroethanes, hexamethylene dibromide and chlorobenzene;

saturated carboxylate esters such as ethyl acetate, n-butyl acetate, i-butyl acetate and methyl propionate;

ketones such as acetone, 2-butanone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol; and the like. These solvents may be used either alone, or in combination of two or more thereof.

The reaction temperature in the polymerization is typically 40° C. to 150° C., and preferably 50° C. to 120° C. The reaction time is typically 1 hour to 48 hrs, and preferably 1 hour to 24 hrs.

(B) Acid Generator

The acid generator (B) generates an acid upon exposure, and the acid allows an acid-labile group present in the polymer (A) to be dissociated, thereby generating a polar group such as a carboxyl group. As a result, the polymer (A) becomes hardly soluble in developer solutions containing an organic solvent. The mode of incorporation of the acid generator (B) into the radiation-sensitive resin composition may be a form of being incorporated as a compound as described below (hereinafter, may be appropriately referred to as "acid generating agent (B)"), a form of being incorporated as a part of a polymer, or a combination of these two forms.

The acid generating agent (B) is exemplified by an onium salt compound, a sulfonimide compound, a halogen-containing compound, a diazo ketone compound, and the like. Of these acid generating agents (B), an onium salt compound is preferred.

Examples of the onium salt compound include sulfonium salts (including tetrahydrothiophenium salts), iodonium salts, phosphonium salts, diazonium salts, pyridinium salts, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, 2-adamantyl-1,1-difluoroethane-1-sulfonate, triphenylphosphonium 1,1,2,2-tetrafluoro-6-(1-adamantanecarbonyloxy)-hexane-1-sulfonate, and the like. Among these, triphenylsulfonium trifluoromethanesulfonate, triphenylsulfonium nonafluoro-n-butanesulfonate, 2-adamantyl-1,1-difluoroethane-1-sulfonate, and triphenylphosphonium 1,1,2,2-tetrafluoro-6-(1-adamantanecarbonyloxy)-hexane-1-sulfonate are preferred.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-H hydroxyphenyl)tetrahydrothiophenium camphorsulfonate, and the like. Among these tetrahydrothiophenium salts, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate and 1-(3,5-dimethyl-4-hydroxyphenyl)tetrahydrothiophenium nonafluoro-n-butanesulfonate are preferred.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like. Among these iodonium salts, bis(4-t-butylphenyl)iodonium nonafluoro-n-butanesulfonate is preferred.

Examples of the sulfonimide compound include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[4.4.0.1$^{2,5}$·1$^{7,10}$]dodecanyl)-1,1-difluoroethanesulfonyloxy)bicyclo[2.2.1]hept-5-ene-2,3-dicarboxyimide, N-(camphorsulfonyloxy)bicyclo[2.2.1]hept-5-ene-2,3-dicarboxyimide, and the like. Among these sulfonimide compounds, N-(trifluoromethanesulfonyloxy)bicyclo[2.2.1]hept-5-ene-2,3-dicarboxyimide is preferred.

These acid generators (B) may be used either alone, or in combination of two or more thereof. The amount of the acid generator (B) employed in the case of the acid generator (B) being the acid generating agent is typically no less than 0.1 parts by mass and no greater than 30 parts by mass, and preferably no less than 0.5 parts by mass and no greater than 20 parts by mass with respect to 100 parts by mass of the polymer (A) in view of ensuring the sensitivity and developability for use as a resist. In this case, when the amount of the acid generating agent (B) employed is less than 0.1 parts by mass, the sensitivity and developability tend to be deteriorated, whereas the amount of the acid generating agent (B) exceeding 30 parts by mass is likely to result in reduction of radiation transmittance, and to render the formation of the desired resist patterns difficult.

Optional Components

In addition to the polymer (A) and the acid generator (B), the radiation-sensitive resin composition may contain a fluorine atom-containing polymer, an acid diffusion controller, a solvent, a surfactant, an alicyclic skeleton-containing compound, a sensitizing agent and the like as optional components within a range not leading to impairment of the effects of the present invention.

Fluorine Atom-Containing Polymer

The radiation-sensitive resin composition may contain a fluorine atom-containing polymer (excluding the polymer (A)). When the radiation-sensitive resin composition contains the fluorine atom-containing polymer, the polymer tends to be unevenly distributed around the surface layer of the resist film in forming the resist film, due to an oil repellent feature of the fluorine atom-containing polymer. Thus, elution of the acid generating agent, the acid diffusion control agent, etc., in the film into the liquid immersion medium during liquid immersion lithography can be inhibited. In addition, owing to a water repellent feature of the fluorine atom-containing polymer, an advancing contact angle of a liquid immersion medium on a resist film can be controlled to fall within a desired range, whereby formation of bubble defects can be suppressed. Furthermore, a higher receding contact angle of a liquid immersion medium on a resist film can be attained, thereby consequently enabling exposure by high-speed scanning without remaining water droplets. The radiation-sensitive resin composition thus containing the fluorine atom-containing polymer enables a resist film to be formed which is suitable for a liquid immersion lithography process.

The fluorine atom-containing polymer is not particularly limited as long as it contains a fluorine atom, and can be generally prepared by polymerizing one or more types of monomers that include a fluorine atom in the structure thereof. The monomers that include a fluorine atom in the structure thereof are exemplified by a monomer that includes a fluorine atom in its main chain, a monomer that includes a fluorine atom in its side chain, and a monomer that includes a fluorine atom in its main chain and side chain.

Examples of the monomer that includes a fluorine atom in its main chain include α-fluoroacrylate compounds, α-trifluoromethyl acrylate compounds, β-fluoroacrylate compounds, β-trifluoromethyl acrylate compounds, α,β-fluoroacrylate compounds, α,β-trifluoromethyl acrylate compounds, compounds derived by substituting hydrogen of one or more types of vinyl moieties by a fluorine atom, a trifluoromethyl group, etc., and the like.

Examples of the monomer that includes a fluorine atom in its side chain include compounds in which an alicyclic olefin compound such as norbornene has a fluorine atom, a fluoroalkyl group and/or a derivative thereof as a side chain, ester compounds produced from acrylic acid or methacrylic acid with fluoroalkyl alcohol and/or a derivative thereof, olefins having a fluorine atom, a fluoroalkyl group and/or a derivative thereof as one or more types of side chain (a site excluding a double bond), and the like.

Examples of the monomer that includes a fluorine atom in its main chain and side chain include ester compounds formed from α-fluoroacrylic acid, β-fluoroacrylic acid, α,β-fluoroacrylic acid, α-trifluoromethyl acrylic acid, β-trifluoromethyl acrylic acid, α,β-trifluoromethylacrylic acid or the like with a fluoroalkyl alcohol and/or a derivative thereof, compounds derived by substituting hydrogen of one or more types of vinyl moieties by a fluorine atom or a trifluoromethyl group and substituting a side chain of the compound with a fluorine atom, a fluoroalkyl group and/or a derived group therefrom; alicyclic olefin compounds derived by substituting hydrogen(s) bonded to one or more types of double bonds by a fluorine atom or a trifluoromethyl group, etc., and having a fluorinated alkyl group and/or a derived group therefrom as a side chain; and the like. The alicyclic olefin compound as referred to herein means a compound that includes a double bond in a part of its ring.

In the fluorine atom-containing polymer, a structural unit that imparts a fluorine atom is not particularly limited, and a structural unit represented by the following formula (F1) (hereinafter, may be also referred to as "structural unit (F-I)") is preferably used as a fluorine atom-imparting structural unit.

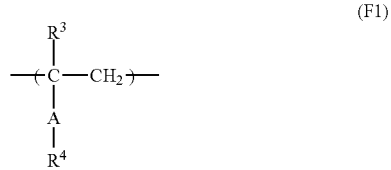

(F1)

In the above formula (F1), $R^3$ represents a hydrogen atom, a fluorine atom, a methyl group or a trifluoromethyl group; A represents a single bond or a divalent linking group; $R^4$ represents linear or branched alkyl group having 1 to 6 carbon atoms and having at least one fluorine atom, or a monovalent alicyclic hydrocarbon group having 4 to 20 carbon atoms or a derived group therefrom.

"A" in the above formula (F1) represents a divalent linking group, and is exemplified by an oxygen atom, a sulfur atom, a carbonyloxy group, an oxycarbonyl group, an amide group, a sulfonylamide group, a urethane group, and the like.

Examples of preferred monomer that gives the structural unit (F-I) include trifluoromethyl(meth)acrylic acid ester, 2,2,2-trifluoroethyl(meth)acrylic acid ester, perfluoroethyl(meth)acrylic acid ester, perfluoro-n-propyl(meth)acrylic acid ester, perfluoro-i-propyl(meth)acrylic acid ester, perfluoro-n-butyl(meth)acrylic acid ester, perfluoro-i-butyl(meth)acrylic acid ester, perfluoro-t-butyl(meth)acrylic acid ester, 2-(1,1,1,3,3,3-hexafluoropropyl)(meth)acrylic acid ester, 1-(2,2,3,3,4,4,5,5-octafluoropentyl)(meth)acrylic acid ester, perfluorocyclohexylmethyl(meth)acrylic acid ester, 1-(2,2,3,3,3-pentafluoropropyl)(meth)acrylic acid ester, 1-(3,3,4,4,5,5,6,6,7,7,8,8,9,9,10,10,10-heptadecafluorodecyl)(meth)acrylic acid ester, and 1-(5-trifluoromethyl-3,3,4,4,5,6,6,6-octafluorohexyl)(meth)acrylic acid ester.

In the fluorine atom-containing polymer, the content of the structural unit (F-I) is typically no less than 5 mol %, preferably no less than 10 mol %, and more preferably no less than 15 mol %. When the content of the structural unit (F-I) is less than 5 mol %, attaining the receding contact angle of no less than 70° may fail, or elution of the acid generating agent, etc., from the resist film may not be inhibited. The fluorine atom-containing polymer may contain only one type, or two or more types of the structural unit (F-I).

In addition to the structural unit that includes a fluorine atom in its structure, the fluorine atom-containing polymer may include at least one type of "other structural units" such as, for example: in order to control rates of dissolution in developer solutions, a structural unit having an acid-labile group, as well as a structural unit having a lactone skeleton, a hydroxyl group, a carboxyl group and/or the like, or a structural unit having an alicyclic group; and/or a structural unit derived from an aromatic compound for inhibiting scattering by reflection of light from the substrate.

The structural unit having an acid-labile group is exemplified by a structural unit represented by the following formula (F2) (hereinafter, may be also referred to as "structural unit (F-II)").

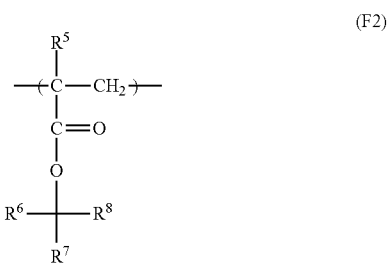

(F2)

In the formula (F2), $R^5$ represents a hydrogen atom, a fluorine atom, a methyl group or a trifluoromethyl group; and $R^6$ to $R^8$ each independently represent a monovalent alicyclic hydrocarbon group having 4 to 20 carbon atoms or a derived group therefrom, or a linear or branched alkyl group having 1 to 4 carbon atoms.

The monovalent alicyclic hydrocarbon group having 4 to 20 carbon atoms represented by $R^5$ in the above formula (F2) is exemplified by a group derived from an alicyclic ring of a cycloalkane such as norbornane, tricyclodecane, tetracyclododecane, adamantane, cyclobutane, cyclopentane, cyclohexane, cycloheptane or cyclooctane; a group obtained by substituting a part or all of hydrogen atoms of the group derived from the alicyclic ring by, for example, at least one type or at least one of linear or branched alkyl groups having 1 to 4 carbon atoms such as a methyl group, an ethyl group, a n-propyl group, an i-propyl group, a n-butyl group, a 2-methylpropyl group, a 1-methylpropyl group and a t-butyl group, and cycloalkyl groups having 3 to 10 carbon atoms such as a cyclobutyl group and a cyclohexyl group, and the like. Alternatively, any two of $R^6$ to $R^8$ may taken together represent a divalent alicyclic hydrocarbon group or a derived group therefrom together with the carbon atom to which the two of $R^6$ to $R^8$ bond. Of these alicyclic hydrocarbon groups, groups derived from an alicyclic ring of norbornane, tricyclodecane, tetracyclododecane, adamantane, cyclopentane or cyclohexane, and groups obtained by substituting hydrogen atoms of the group derived from these alicyclic rings by the alkyl group are preferred.

In addition, examples of the linear or branched alkyl group having 1 to 4 carbon atoms represented by $R^6$ to $R^8$ in the above formula (F2) include a methyl group, an ethyl group, a n-propyl group, an i-propyl group, a n-butyl group, a 2-methylpropyl group, a 1-methylpropyl group, a t-butyl group, and the like.

In the above formula (F2), examples of preferred acid-labile group, i.e., groups that bind to an oxygen atom of an ester group include groups derived by substituting a t-butyl group, a 1-n-(1-ethyl-1-methyl)propyl group, a 1-n-(1,1-dimethyl)propyl group, a 1-n-(1,1-dimethyl)butyl group, a 1-n-(1,1-dimethyl)pentyl group, a 1-(1,1-diethyl)propyl group, a 1-n-(1,1-diethyl)butyl group, a 1-n-(1,1-diethyl)pentyl group, a 1-(1-methyl)cyclopentyl group, a 1-(1-ethyl)cyclopentyl group, a 1-(1-n-propyl)cyclopentyl group, a 1-(1-i-propyl)cyclopentyl group, a 1-(1-methyl)cyclohexyl group, a 1-(1-ethyl)cyclohexyl group, a 1-(1-n-propyl)cyclohexyl group, a 1-(1-i-propyl)cyclohexyl group, a 1-{1-methyl-1-(2-norbornyl)}ethyl group, a 1-{1-methyl-1-(2-tetracyclodecanyl)}ethyl group, a 1-{1-methyl-1-(1-adamantyl)}ethyl group, a 2-(2-methyl)norbornyl group, a 2-(2-ethyl)norbornyl group, a 2-(2-n-propyl)norbornyl group, a 2-(2-i-propyl)norbornyl group, a 2-(2-methyl)tetracyclodecanyl group, a 2-(2-ethyl)tetracyclodecanyl group, a 2-(2-n-propyl)tetracyclodecanyl group, a 2-(2-i-propyl)tetracyclodecanyl group, a 1-(1-methyl)adamantyl group, a 1-(1-ethyl)adamantyl group, a 1-(1-n-propyl)adamantyl group, a 1-(1-i-propyl) adamantyl group, or a group constituted with any of these alicyclic rings with, for example, at least one type or at least one of cyclic alkyl groups having 3 to 10 carbon atoms, or linear or branched alkyl groups having 1 to 4 carbon atoms such as a methyl group, an ethyl group, a n-propyl group, an i-propyl group, a n-butyl group, a 2-methylpropyl group, a 1-methylpropyl group and a t-butyl group, and the like.

Examples of preferred monomer that gives the structural unit (F-II) include (meth)acrylic acid 2-methyladamantyl-2-yl ester, (meth)acrylic acid 2-methyl-3-hydroxyadamantyl-2-yl ester, (meth)acrylic acid 2-ethyladamantyl-2-yl ester, (meth)acrylic acid 2-ethyl-3-hydroxyadamantyl-2-yl ester, (meth)acrylic acid 2-n-propyladamantyl-2-yl ester, (meth)acrylic acid 2-isopropyladamantyl-2-yl ester, (meth)acrylic acid-2-methylbicyclo[2.2.1]hept-2-yl ester, (meth)acrylic acid-2-ethylbicyclo[2.2.1]hept-2-yl ester, (meth)acrylic acid-8-methyltricyclo[5.2.1.0$^{2,6}$]decan-8-yl ester, (meth) acrylic acid-8-ethyltricyclo[5.2.1.0$^{2,6}$]decan-8-yl ester, (meth)acrylic acid-4-methyltetracyclo[6.2.1$^{3,6}$.0$^{2,7}$]dodecan-4-yl ester, (meth)acrylic acid-4-ethyltetracyclo[6.2.1$^{3,6}$.0$^{2,7}$]dodecan-4-yl ester, (meth)acrylic acid 1-(bicyclo[2.2.1]hept-2-yl)-1-methylethyl ester, (meth)acrylic acid 1-(tricyclo[5.2.1.0$^{2,6}$]decan-8-yl)-1-methylethyl ester, (meth)acrylic acid 1-(tetracyclo[6.2.1$^{3,6}$.0$^{2,7}$]dodecan-4-yl)-1-methylethyl ester, (meth)acrylic acid 1-(adamantan-1-yl)-1-methylethyl ester, (meth)acrylic acid 1-(3-hydroxyadamantan-1-yl)-1-methylethyl ester, (meth)acrylic acid 1,1-dicyclohexylethyl ester, (meth)acrylic acid 1,1-di(bicyclo[2.2.1]hept-2-yl)ethyl ester, (meth)acrylic acid 1,1-di(tricyclo[5.2.1.0$^{2,6}$]decan-8-yl)ethyl ester, (meth)acrylic acid 1,1-di(tetracyclo[6.2.1$^{3,6}$.0$^{2,7}$]dodecan-4-yl)ethyl ester, (meth)acrylic acid 1,1-di(adamantan-1-yl)ethyl ester, (meth) acrylic acid 1-methyl-1-cyclopentyl ester, (meth)acrylic acid 1-ethyl-1-cyclopentyl ester, (meth)acrylic acid 1-methyl-1-cyclohexyl ester, (meth)acrylic acid 1-ethyl-1-cyclohexyl ester, and the like.

Of these monomers, (meth)acrylic acid 2-methyladamantyl-2-yl ester, (meth)acrylic acid 2-ethyladamantyl-2-yl ester, (meth)acrylic acid 2-methylbicyclo[2.2.1]hept-2-yl ester, (meth)acrylic acid 2-ethylbicyclo[2.2.1]hept-2-yl ester, (meth)acrylic acid 1-(bicyclo[2.2.1]hept-2-yl)-1-methylethyl ester, (meth)acrylic acid 1-(adamantan-1-yl)-1-methylethyl ester, (meth)acrylic acid 1-methyl-1-cyclopentyl ester, (meth)acrylic acid 1-ethyl-1-cyclopentyl ester, (meth)acrylic acid 1-methyl-1-cyclohexyl ester, (meth)acrylic acid 1-ethyl-1-cyclohexyl ester, are preferred.

As the structural unit having a lactone skeleton, a structural unit similar to the structural unit (III) of the polymer (A) (hereinafter, may be also referred to as "structural unit (F-III)") may be used.

The structural unit having an alicyclic group (hereinafter, may be also referred to as "structural unit (F-IV)") is exemplified by a structural unit represented by the following formula (F4), and the like.

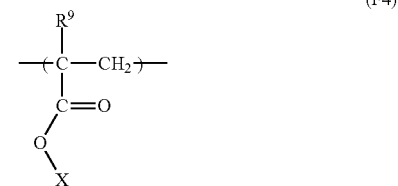

(F4)

In the formula (F4), $R^9$ represents a hydrogen atom, a fluorine atom, a methyl group, or a trifluoromethyl group; and X represents a monovalent alicyclic hydrocarbon group having 4 to 20 carbon atoms.

The monovalent alicyclic hydrocarbon group having 4 to 20 carbon atoms represented by X in the above formula (F4) is exemplified by hydrocarbon groups derived from an alicyclic ring of a cycloalkane such as cyclobutane, cyclopentane, cyclohexane, bicyclo[2.2.1]heptane, bicyclo[2.2.2]octane, tricyclo[5.2.1.02,6]decane, tetracyclo[6.2.1.13,6.02,7]dodecane or tricyclo[3.3.1.13,7]decane. These hydrocarbon groups derived from an alicyclic ring derived from a cycloalkane may have a substituent, and may be substituted with, for example, at least one type or at least one of linear or branched alkyl groups having 1 to 4 carbon atoms such as a methyl group, an ethyl group, a n-propyl group, an i-propyl group, a n-butyl group, a 2-methylpropyl group, a 1-methylpropyl group and a t-butyl group, or at least one type or at least one of cycloalkyl group having 3 to 10 carbon atoms. The substituent is not limited to these alkyl groups and cycloalkyl groups, and the hydrocarbon group may be substituted with a hydroxyl group, a cyano group, a hydroxyalkyl group having 1 to 10 carbon atoms, a carboxyl group, or an oxygen atom.

Examples of preferred monomer that gives the structural unit (F-IV) include (meth)acrylic acid-bicyclo[2.2.1]hept-2-yl ester, (meth)acrylic acid-bicyclo[2.2.2]oct-2-yl ester, (meth)acrylic acid-tricyclo[5.2.1.02,6]dec-7-yl ester, (meth) acrylic acid-tetracyclo[6.2.1.13,6.02,7]dodec-9-yl ester, (meth)acrylic acid-tricyclo[3.3.1.13,7]dec-1-yl ester, (meth) acrylic acid-tricyclo[3.3.1.13,7]dec-2-yl ester, and the like.

Also, examples of preferred monomer that generates the structural unit derived from an aromatic compound (hereinafter, may be also referred to as "structural unit (F-V)") include styrene, α-methylstyrene, 2-methylstyrene, 3-methylstyrene, 4-methylstyrene, 2-methoxystyrene, 3-methoxystyrene, 4-methoxystyrene, 4-(2-t-butoxycarbonylethyloxy) styrene, 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, 2,4,6-trihydroxystyrene, 4-t-butoxystyrene, 4-t-butoxy-α-methylstyrene, 4-(2-ethyl-2-propoxy)styrene, 4-(2-ethyl-2-propoxy)-α-methylstyrene, 4-(1-ethoxyethoxy)styrene, 4-(1-ethoxyethoxy)-α-methylstyrene, phenyl(meth)acrylate, benzyl(meth)acrylate, acenaphthylene, 5-hydroxyacenaphthylene, 1-vinylnaphthalene, 2-vinylnaphthalene, 2-hydroxy-6-vinylnaphthalene, 1-naphthyl(meth)acrylate, 2-naphthyl(meth)acrylate, 1-naphthylmethyl(meth)acrylate, 1-anthryl(meth)acrylate, 2-anthryl(meth)acrylate, 9-anthryl (meth)acrylate, 9-anthrylmethyl(meth)acrylate, 1-vinylpyrene, and the like.

The "other structural unit" included in the fluorine atom-containing polymer may have only one type, or two or more types of the structural unit (F-II), the structural unit (F-III), the structural unit (F-IV) and the structural unit (F-V). In the fluorine atom-containing polymer, the content of these other structural units is typically no greater than 80 mol %, preferably no greater than 75 mol %, and more preferably no greater than 70 mol % with respect to the entire structural units constituting the fluorine atom-containing polymer.

Synthesis Method of Fluorine Atom-Containing Polymer

The fluorine atom-containing polymer may be synthesized, for example, by polymerizing the monomer corresponding to each predetermined structural unit in an appropriate solvent using a radical polymerization initiator.

Acid Diffusion Controller

The acid diffusion controller exerts the effect of controlling diffusion phenomenon of the acid generated from the acid generator (B) upon the exposure in the resist film, and suppressing unfavorable chemical reactions in unexposed regions. In addition, storage stability of the resultant radiation-sensitive resin composition is further improved, and resolution of the resist is further improved, while suppressing variation of line width of the resist pattern caused by variation of post-exposure delay (PED) from the exposure until a development treatment, thereby capable of imparting superior process stability to be obtained. It is to be noted that the mode of incorporation of the acid diffusion controller into the composition may be in a free compound form or in an incorporated form as a part of the polymer, or in both of these forms.

Examples of the acid diffusion control agent include amine compounds, amide group-containing compounds, urea compounds, nitrogen-containing heterocyclic compounds, and the like.

Examples of the amine compounds include mono(cyclo) alkylamines; di(cyclo)alkylamines; tri(cyclo)alkylamines; substituted alkylaniline or derivatives thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis (4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl) ether, bis (2-diethylaminoethyl) ether, 1-(2-hydroxyethyl)-2-imidazolidinone, 2-quinoxalinol, N,N,N',N'-tetrakis(2-hydroxypropyl)ethylenediamine, N,N,N',N''N''-pentamethyldiethylenetriamine, and the like.

Examples of the amide group-containing compound include N-t-butoxycarbonyl group-containing amino compounds, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include imidazoles; pyridines; piperazines; pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2] octane, and the like.

Also, a photodegradable base which is sensitized upon exposure to generate a weak acid may be used as the acid diffusion control agent. The photodegradable base generates an acid at light-exposed sites, leading to an increase of insolubility of the polymer (A) in the developer solution, and as a result, roughness of the surface of the light-exposed sites after development is suppressed. On the other hand, the photodegradable base exerts a high acid-capturing function by an anion at light-unexposed sites and serves as a quencher, and thus captures the acid diffused from the light-exposed sites. In other words, since the photodegradable base serves as a quencher only at light-unexposed sites, the contrast resulting from a deprotection reaction is improved, and consequently the resolution can be further improved. An exemplary photodegradable base includes onium salt compounds which degrade upon the exposure and lose their acid diffusion controllability. Examples of the onium salt compounds include sulfonium salt compounds represented by the following formula (D1), and iodonium salt compounds represented by the following formula (D2).

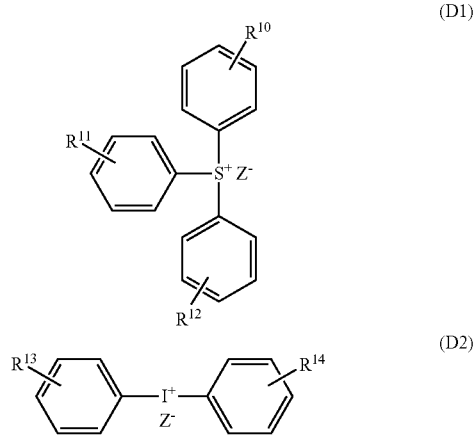

In the above formula (D1) and formula (D2), $R^{10}$ to $R^{14}$ each independently represent a hydrogen atom, an alkyl group, an alkoxy group, a hydroxyl group, a halogen atom or $-SO_2-R^C$, wherein $R^C$ represents an alkyl group, a cycloalkyl group, an alkoxy group or aryl group; $Z^-$ represents $OH^-$, $R^{15}-COO^-$, $R^D-SO_2-N^--R^{15}$, $R^{15}-SO_3^-$ or an anion represented by the following formula (D3), wherein $R^{15}$ represents a linear or branched alkyl group having 1 to 10 carbon atoms, a cycloalkyl group having 3 to 20 carbon atoms, an aryl group having 6 to 30 carbon atoms, or an alkaryl group having 7 to 30 carbon atoms, wherein a part or all of hydrogen atoms of the alkyl group, the cycloalkyl group, the aryl group and the alkaryl group are not substituted or substituted, and $R^D$ represents a linear or branched alkyl group having 1 to 10 carbon atoms, or a cycloalkyl group having 3 to 20 carbon atoms which may have a substituent, wherein a part or all of hydrogen atoms of the alkyl group and the cycloalkyl group are not substituted or substituted by a fluorine atom, and provided that $Z^-$ represents $R^{15}-SO_3^-$, any case where a fluorine atom binds to the carbon atom to which $SO_3^-$ bond is excluded.

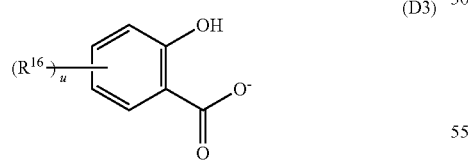

In the above formula (D3), $R^{16}$ represents a linear or branched alkyl group having 1 to 12 carbon atoms, or a linear or branched alkoxyl group having 1 to 12 carbon atoms, wherein a part or all of hydrogen atoms included in the above alkyl group and alkoxyl group are not substituted or substituted by a fluorine atom; and u is an integer of 0 to 2.

The $R^{10}$ to $R^{14}$ preferably represent a hydrogen atom or $-SO_2-R^C$. Also, $R^C$ represents preferably a cycloalkyl group, and more preferably a cyclohexyl group.

Examples of the alkyl group represented by $R^{15}$ include a methyl group, an ethyl group, a propyl group, an i-propyl group, a butyl group, an i-butyl group, a t-butyl group and the like, and groups derived by substituting a part or all of hydrogen atoms of these groups, and the like.

Examples of the cycloalkyl group represented by $R^{15}$ include a cyclopentyl group, a cyclohexyl group, a norbornyl group, a tricyclodecanyl group, a tetracyclododecanyl group, an adamantyl group and the like, and groups derived by substituting a part or all of hydrogen atoms of these groups, and the like.

Examples of the aryl group represented by $R^{15}$ include a phenyl group, a naphthyl group, an anthryl group and the like, and groups derived by substituting a part or all of hydrogen atoms of these groups, and the like.

Examples of the alkaryl group represented by $R^{15}$ include a benzyl group, a phenylethyl group, a phenylpropyl group, and groups derived by substituting a part or all of hydrogen atoms of these groups, and the like.

The substituent which may be included in the alkyl group, the cycloalkyl group, the aryl group and the alkaryl group is exemplified by a hydroxyl group, a halogen atom, an alkoxy group, a lactone group, an alkylcarbonyl group, and the like.

Examples of the alkyl group represented by $R^D$ include a methyl group, an ethyl group, a propyl group, a butyl group, and the like.

Examples of the cycloalkyl group represented by $R^D$ include a cyclopentyl group, a cyclohexyl group, a norbornyl group, an adamantyl group, and the like.

The photodegradable base is exemplified by compounds represented by the following formulae, and the like.

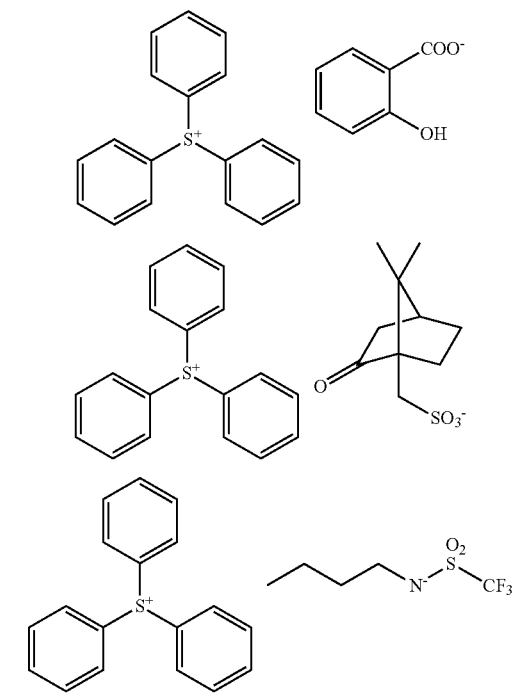

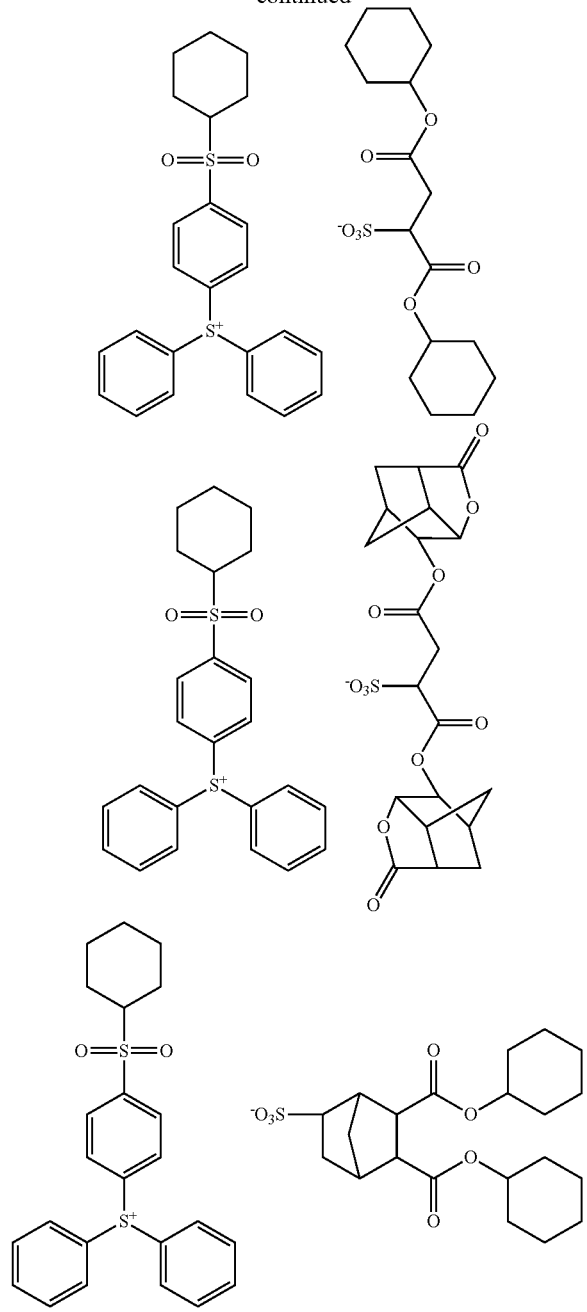

The content of the acid diffusion control agent in the radiation-sensitive resin composition is preferably less than 10 parts by mass with respect to 100 parts by mass of the polymer (A). When the total amount used exceeds 10 parts by mass, sensitivity as a resist tends to be deteriorated. These acid diffusion control agents may be used either alone, or in combination of two or more thereof.

Solvent

The composition typically contains a solvent. The solvent is not particularly limited as long as the solvent can at least dissolve the polymer (A), and the acid generator (B), and optional components added as required. Examples of the solvent include alcohol solvents, ether solvents, ketone solvents, amide solvents, ester solvents and mixed solvents thereof, and the like.

Specific examples of the solvent include similar organic solvents to those exemplified in connection with the step (3) of forming a pattern. Among these, propylene glycol monomethyl ether acetate, cyclohexanone and γ-butyrolactone are preferred. These solvents may be used either alone, or in combination of two or more thereof.

Surfactant

The surfactant achieves an effect of further improving coating property, striation, developability and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, polyethylene glycol distearate, and the like. Commercially available products of the surfactant include KP341 (Shin-Etsu Chemical Co., Ltd.); POLYFLOW No. 75, and No. 95 (Kyoeisha Chemical Co., Ltd.), F-top EF301, EF303, and EF352 (Tochem Products Co. Ltd.), Megafac F171, F173 (Dainippon Ink And Chemicals, Incorporated), Fluorad FC430, and FC431 (Sumitomo 3M Ltd.), Asahi-Guard AG710, Surflon S-382, SC-101, SC-102, SC-103, SC-104, SC-105, and SC-106 (Asahi Glass Co., Ltd.), and the like. These surfactants may be used either alone, or in combination of two or more thereof.

Alicyclic Skeleton-Containing Compound

The alicyclic skeleton-containing compound achieves an effect of improving dry etching resistance, pattern configuration, adhesiveness to a substrate, and the like.

Examples of the alicyclic skeleton-containing compound include:

adamantane derivatives such as 1-adamantanecarboxylic acid, 2-adamantanone and t-butyl 1-adamantanecarboxylate;

deoxycholic acid esters such as t-butyl deoxycholate, t-butoxycarbonylmethyl deoxycholate and 2-ethoxyethyl deoxycholate;

lithocholic acid esters such as t-butyl lithocholate, t-butoxycarbonylmethyl lithocholate and 2-ethoxyethyl lithocholate;

3-[2-hydroxy-2,2-bis(trifluoromethyl)ethyl]tetracyclo[4.4.0.1$^{2,5}$.1$^{7,10}$]dodecane, 2-hydroxy-9-methoxycarbonyl-5-oxo-4-oxa-tricyclo[4.2.1.0$^{3,7}$]nonane, and the like. These alicyclic skeleton-containing compounds may be used either alone, or in combination of two or more thereof.

Sensitizing Agent

The sensitizing agent exhibits an action of increasing the amount of the acid generator (B) produced, and thus has an effect of improving "apparent sensitivity" of the radiation-sensitive resin composition.

The sensitizing agent is exemplified by carbazoles, acetophenones, benzophenones, naphthalenes, phenols, biacetyl, eosin, rose bengal, pyrenes, anthracenes, phenothiazines, and the like. These sensitizing agent may be used either alone, or in combination of two or more thereof.

Preparation of Radiation-Sensitive Resin Composition

The radiation-sensitive resin composition can be prepared by mixing, for example, the polymer (A), the acid generator (B) and the optional component(s) at a certain ratio. Also, it is possible to prepare the radiation-sensitive resin composition in a state of being dissolved or dispersed in an appropriate organic solvent.

EXAMPLES

Hereinafter, the present invention will be explained more specifically by way of Examples, but the present invention is not limited to these Examples. Methods of the determination of various types of physical property values are shown below.

Weight Average Molecular Weight (Mw) and Number Average Molecular Weight (Mn)

The Mw and the Mn of the polymer were determined by gel permeation chromatography (GPC) using GPC columns ("G2000 HXL" x 2, "G3000 HXL×1, "G4000 HXL"×1) manufactured by Tosoh Corporation under the following conditions.

eluent: tetrahydrofuran (manufactured by Wako Pure Chemical Industries, Ltd.)

flow rate: 1.0 mL/min sample concentration: 1.0% by mass amount of injected sample: 100 μL detector: differential refractometer standard substance: mono-dispersed polystyrene Content of Low Molecular Weight Component The content (% by mass) low molecular weight component (component having a molecular weight of less than 1,000) in the polymer (A) was determined by high performance liquid chromatography (HPLC) using "Inertsil ODS-25 μm column" (4.6 mmϕ×250 mm) manufactured by GL Sciences, Inc., under the following conditions.

eluent: acrylonitrile/0.1% aqueous phosphoric acid solution flow rate: 1.0 mL/min sample concentration: 1.0% by mass amount of injected sample: 100 μL detector: differential refractometer $^{13}$C-NMR Analysis:

The analysis was carried out using "JNM-EX400" manufactured by JEOL, Ltd., with DMSO-$d_6$ for use as a solvent for measurement.

Synthesis of Polymer (A)

In each Synthesis Example, polymers (A-1) to (A-13), (a-1) and (a-2), and a fluorine atom-containing polymer (C-1) described later were synthesized using compounds each represented by the following formulae (M-1) to (M-10) (hereinafter, may be referred to as "compound (M-1)").

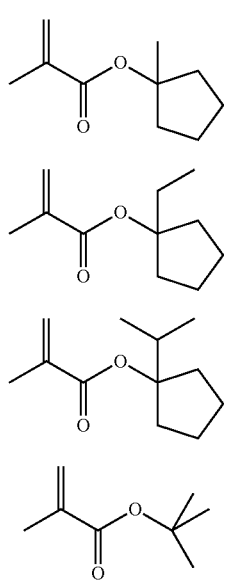

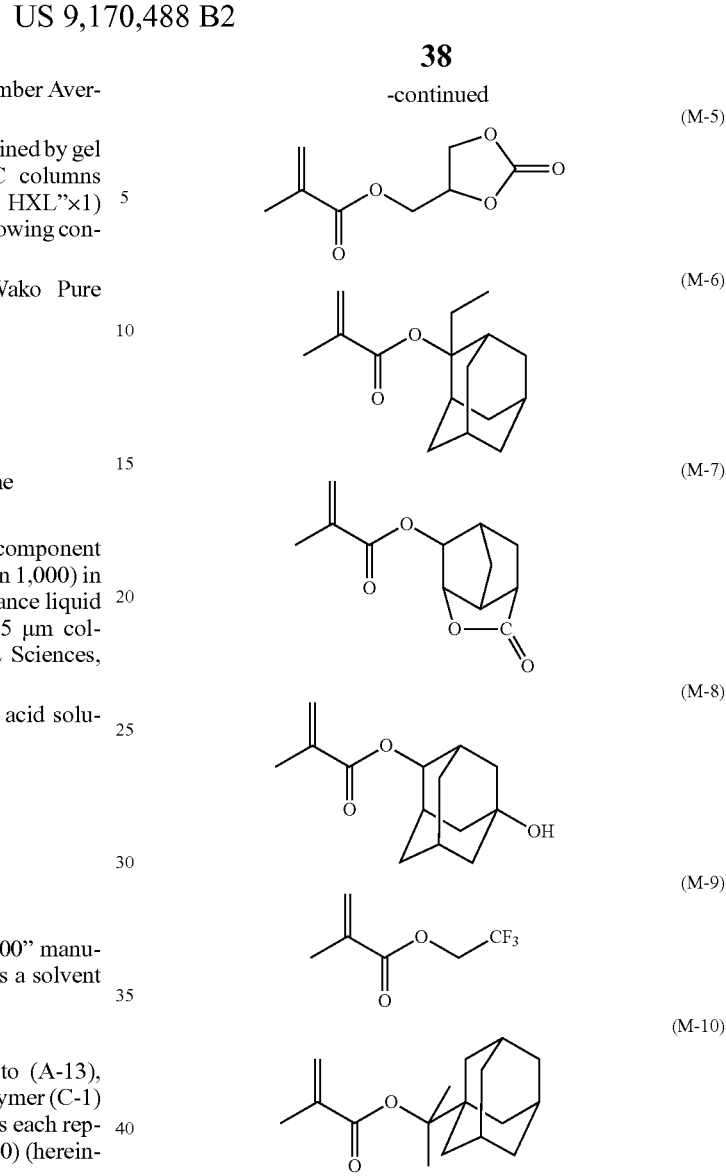

Synthesis Example 1

Synthesis of Polymer (A-1)

A monomer solution was prepared by dissolving 43.08 g (50 mol %) of the compound (M-1) and 56.92 g (50 mol %) of the compound (M-7) in 200 g of 2-butanone, and then adding thereto 4.21 g (5 mol % with respect to the total amount of a monomer compounds) of AIBN. A 1,000 mL three-necked flask charged with 100 g of 2-butanone was purged with nitrogen for 30 minutes, and thereafter heated to 80° C. with stirring. The monomer solution prepared was added dropwise using a dropping funnel over 3 hrs. The time when dropwise addition was started was assumed to be a start time point of the polymerization reaction, and the polymerization reaction was carried out for 6 hours. After completion of the polymerization reaction, the polymerization solution was cooled to no greater than 30° C. by water-cooling. The cooled polymerization solution was charged into 2.00 g of methanol, and the white powder precipitated was filtered off. Thus resultant white powder was washed twice with 400 g of methanol, and thereafter filtered off and dried at 50° C. for 17 hrs to obtain a polymer (A-1) in the form of a white powder (73 g; yield: 73%). The Mw of the obtained polymer (A-1) was 7,730, the Mw/Mn was 1.51, and the content of the low molecular weight component was 0.05% by mass. In addition, the contents of structural unit derived from the compound (M-1) and the structural unit derived from the compound (M-7) in the polymer (A-1) as determined by the $^{13}$C-NMR analysis were 47.3 mol % and 52.7 mol %, respectively.

Synthesis Examples 2 to 17

Polymers (A-2) to (A-15), and polymers (a-1) and (a-2) were obtained in a similar manner to Synthesis Example 1 except that the type and the amount blended of each monomer compound used, and the charged amount of AIBN as a polymerization initiator (molar ratio with respect to the total amount of the monomer compounds) were as presented in Tables 1-1 and 1-2. Also, the content of the structural units derived from each monomer compound, the Mw, the Mw/Mn ratio and the content of the low molecular weight component of the obtained each polymer are collectively shown in Tables 1-1 and 1-2.

TABLE 1-1

| | (A) Component | Ratio of charged monomer | | | | | | Amount of charged AIBN (mol %) | Content of structural units | |
|---|---|---|---|---|---|---|---|---|---|---|
| | | structural unit(I) | | structural unit(II) | | structural unit(III) | | | structural unit(I) | |
| | | compound | mol % | compound | mol % | compound | mol % | | compound | mol % |
| Synthesis Example 1 | A-1 | M-1 | 50 | — | — | M-7 | 50 | 5.0 | M-1 | 47.3 |
| Synthesis Example 2 | A-2 | M-1 | 50 | — | — | M-7 | 50 | 2.0 | M-1 | 50.1 |
| Synthesis Example 3 | A-3 | M-1 | 50 | — | — | M-7 | 50 | 1.0 | M-1 | 50.3 |
| Synthesis Example 4 | A-4 | M-2 | 50 | — | — | M-7 | 50 | 1.5 | M-2 | 49.4 |
| Synthesis Example 5 | A-5 | M-3 | 50 | — | — | M-7 | 50 | 3.0 | M-3 | 48.1 |
| Synthesis Example 6 | A-6 | M-4 | 50 | — | — | M-7 | 50 | 2.0 | M-4 | 46.9 |
| Synthesis Example 7 | A-7 | M-1 | 40 | — | — | M-5 | 10 | 3.5 | M-1 | 38.1 |
| | | | | | | M-7 | 50 | | | |
| Synthesis Example 8 | A-8 | M-1 | 35 | — | — | M-7 | 50 | 5.0 | M-1 | 33.0 |
| | | M-6 | 15 | | | | | | M-6 | 12.9 |

| | Content of structural units | | | | | | Content of low-molecular weight component (% by mass) |
|---|---|---|---|---|---|---|---|
| | structural unit(II) | | structural unit(III) | | | | |
| | compound | mol % | compound | mol % | Mw | Mw/Mn | |
| Synthesis Example 1 | — | — | M-7 | 52.7 | 7,730 | 1.51 | 0.05 |
| Synthesis Example 2 | — | — | M-7 | 49.9 | 13,020 | 1.56 | 0.04 |
| Synthesis Example 3 | — | — | M-7 | 49.7 | 20,890 | 1.61 | 0.03 |
| Synthesis Example 4 | — | — | M-7 | 50.6 | 16,580 | 1.59 | 0.05 |
| Synthesis Example 5 | — | — | M-7 | 51.9 | 9,860 | 1.48 | 0.04 |
| Synthesis Example 6 | — | — | M-7 | 53.1 | 13,460 | 1.53 | 0.05 |
| Synthesis Example 7 | — | — | M-5 | 9.0 | 8,790 | 1.49 | 0.05 |
| | | | M-7 | 52.9 | | | |
| Synthesis Example 8 | — | — | M-7 | 54.1 | 7,020 | 1.50 | 0.03 |

TABLE 1-2

| | (A) Component | Ratio of charged monomer | | | | | | Amount of charged AIBN (mol %) | Content of structural units | |
|---|---|---|---|---|---|---|---|---|---|---|
| | | structural unit(I) | | structural unit(II) | | structural unit(III) | | | structural unit(I) | |
| | | compound | mol % | compound | mol % | compound | mol % | | compound | mol % |
| Synthesis Example 9 | A-9 | M-3 | 40 | — | — | M-7 | 50 | 2.0 | M-3 | 38.4 |
| | | M-10 | 10 | | | | | | M-10 | 10.2 |

TABLE 1-2-continued

| | | | | | | | | | | |
|---|---|---|---|---|---|---|---|---|---|---|
| Synthesis Example 10 | A-10 | M-1 M-6 | 40 10 | — | — | M-7 | 50 | 2.0 | M-1 M-6 | 39.2 7.6 |
| Synthesis Example 11 | A-11 | M-3 M-6 | 40 10 | — | — | M-7 | 50 | 2.0 | M-3 M-6 | 39.7 7.7 |
| Synthesis Example 12 | A-12 | M-2 M-10 | 45 15 | — | — | M-7 | 40 | 1.5 | M-2 M-10 | 43.9 15.3 |
| Synthesis Example 13 | A-13 | M-3 M-10 | 45 15 | — | — | M-7 | 40 | 2.5 | M-3 M-10 | 44.1 15.7 |
| Synthesis Example 14 | a-1 | M-1 | 50 | — | — | M-7 | 50 | 10.0 | M-1 | 46.2 |
| Synthesis Example 15 | a-2 | M-1 | 30 | M-8 | 20 | M-7 | 50 | 4.0 | M-1 | 28.1 |

| | Content of structural units | | | | | | Content of low-molecular weight component (% by mass) |
|---|---|---|---|---|---|---|---|
| | structural unit(II) | | structural unit(III) | | | | |
| | compound | mol % | compound | mol % | Mw | Mw/Mn | |
| Synthesis Example 9 | — | — | M-7 | 51.4 | 11,740 | 1.55 | 0.04 |
| Synthesis Example 10 | — | — | M-7 | 53.2 | 11,910 | 1.59 | 0.03 |
| Synthesis Example 11 | — | — | M-7 | 52.6 | 11,430 | 1.53 | 0.04 |
| Synthesis Example 12 | — | — | M-7 | 40.8 | 14,870 | 1.58 | 0.04 |
| Synthesis Example 13 | — | — | M-7 | 40.2 | 10,260 | 1.50 | 0.03 |
| Synthesis Example 14 | — | — | M-7 | 53.8 | 4,700 | 1.41 | 0.07 |
| Synthesis Example 15 | M-8 | 18.8 | M-7 | 53.1 | 7,840 | 1.48 | 0.05 |

(C) Synthesis of Fluorine Atom-Containing Polymer

Synthesis Example 18

Synthesis of Polymer (C-1)

A monomer solution was prepared by dissolving 71.67 g (70 mol %) of the compound (M-2) and 28.33 g (30 mol %) of the compound (M-9) in 100 g of 2-butanone, and then adding thereto 10.35 g of dimethyl 2,2'-azobisisobutyrate. A 1,000 mL three-necked flask charged with 100 g of 2-butanone was purged with nitrogen for 30 minutes, and thereafter heated to 80° C. with stirring. The monomer solution prepared was added dropwise using a dropping funnel over 3 hrs. The time when dropwise addition was started was assumed to be a start time point of the polymerization reaction, and the polymerization reaction was carried out for 6 hours. After completion of the polymerization reaction, the polymerization solution was cooled to no greater than 30° C. by water-cooling. The reaction solution was transferred to a 4 L separatory funnel, then homogenously diluted with 300 g of n-hexane, and 1,200 g of methanol was charge thereto followed by mixing. Subsequently, 60 g of distilled water was charged, and the mixture was further stirred and allowed to stand for 30 min. Thereafter, the under layer was recovered to give a propylene glycol monomethyl ether acetate solution (yield: 60%). The Mw of the obtained polymer (C-1) was 7,200, the Mw/Mn was 2.00, and the content of the low molecular weight component was 0.07% by mass. In addition, the contents of structural unit derived from the compound (M-2) and the structural unit derived from the compound (M-9) in the polymer (C-1) as determined by the $^{13}$C-NMR analysis were 71.1 mol % and 28.9 mol %, respectively.

Preparation of Radiation-Sensitive Resin Composition

Each component (acid generating agent (B), acid diffusion control agent (D) and solvent (E)) that constitutes the radiation-sensitive resin compositions in addition to the polymers (A-1) to (A-15), (a-1) and (a-2), and (C-1) prepared in the Examples and Synthesis Examples is shown below.

(B) Acid Generating Agent

Compounds represented by the following formulae (B-1) and (B-2), respectively (B-1): triphenylsulfonium 6-adamantylcarbonyloxy-1,1,2,2-tetrafluorohexane-1-sulfonate (B-2): 2-adamantyl-1,1-difluoroethane-1-sulfonate

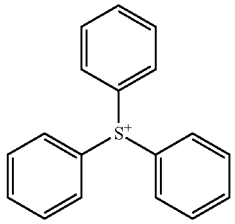
(B-1)

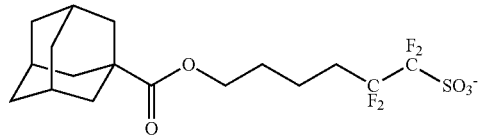
(B-2)

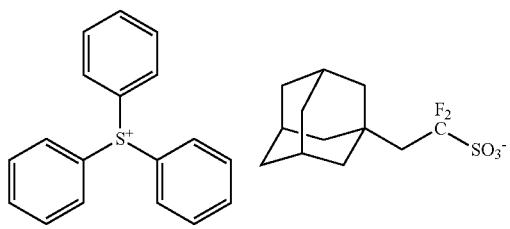

(D) Acid Diffusion Control Agent

Compounds represented by the following formulae (D-1) to (D-6), respectively (D-1): 4-hydroxy-N-amyloxycarbonylpiperidine (D-2): triphenylsulfonium salicylate (D-3): triphenylsulfonium camphorsulfonate (D-4): triphenylsulfonium N-n-butyltrifluoromethylsulfoneamide (D-5): 4-cyclohexylsulfonylphenyldiphenylsulfonium 1,2-di(cyclohexyloxycarbonyl)ethane-1-sulfonate (D-6): 4-cyclohexylsulfonylphenyldiphenylsulfonium 1,2-di(norbornanelactonyloxycarbonyl)ethane-1-sulfonate

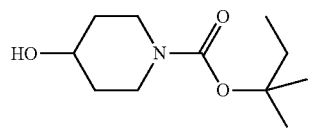
(D-1)

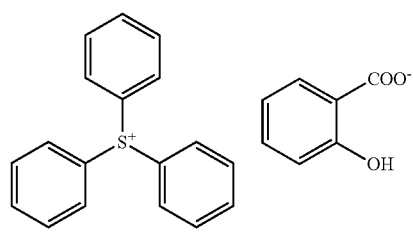
(D-2)

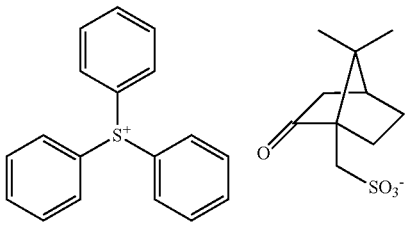
(D-3)

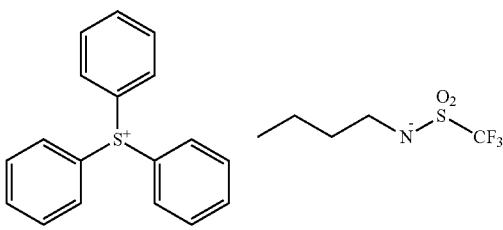
(D-4)

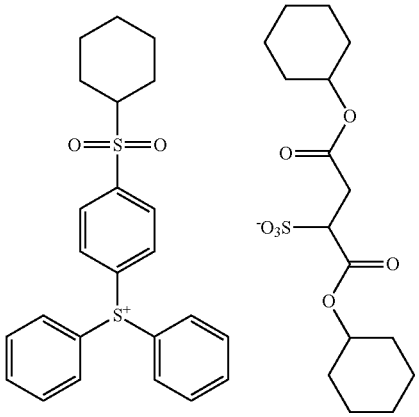
(D-5)

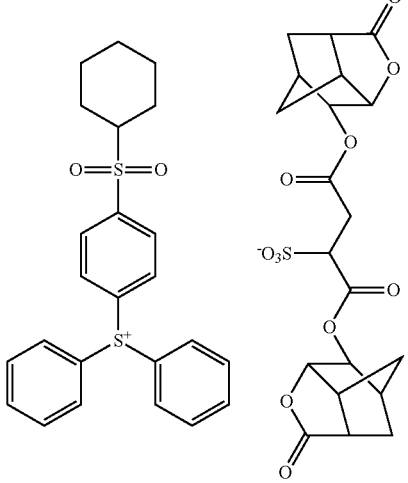
(D-6)

(E) Solvent (E-1): propylene glycol monomethyl ether acetate (E-2): cyclohexanone (E-3): γ-butyrolactone

Example 1

A radiation-sensitive resin composition (J-1) was prepared by mixing 100 parts by mass of the polymer (A-1) obtained in Synthesis Example 1, 3 parts by mass of the fluorine atom-containing polymer (C-1) obtained in Synthesis Example 11, 11 parts by mass of the acid generating agent (B-1), 4.5 parts by mass of the acid diffusion control agent (D-2), and as the solvent 1,620 parts by mass of (E-1), 700 parts by mass of (E-2) and 30 parts by mass of (E-3), and then filtering the obtained mixture through a filter having a pore size of 0.20 μm.

Examples 2 to 19 and Synthesis Example 19 to 21

Each of radiation-sensitive resin compositions (J-2) to (J-21) and (j-1) to (j-3) was prepared in a similar manner to Example 1 except that each component of the type and the amount blended shown in Tables 2-1 and 2-2 below was mixed.

Formation of Resist Pattern

Example 22

On a 12-inch silicon wafer which had been provided with an underlayer antireflective film ("ARC66", manufactured by Nissan Chemical Industries, Ltd.) having a film thickness of 105 nm, a coating film having a film thickness of 100 nm was provided using the radiation-sensitive resin composition (J-1) prepared in Example 1, and then soft baking (SB) was carried out at 90° C. for 60 sec. Next, the coating film was exposed through a mask pattern by which a pattern provided after reduction projection had a dot of 55 nm and a pitch of 110 nm under conditions involving NA of 1.3, iNA of 1.27 and a ratio of 0.800, with Quadrupole, using an ArF excimer laser liquid immersion scanner ("NSR S610C", manufactured by NIKON Corporation). After the exposure, post-exposure baking (PEB) was carried out at 105° C. for 60 sec. Subsequently, the film was developed with methyl-n-amyl ketone at 23° C. for 30 sec, and subjected to a rinse treatment with 4-methyl-2-pentanol for 10 sec and dried to obtain a resist pattern. In

TABLE 2-1

| | Radiation-sensitive resin composition | (A) Component | | (B) Acid generating agent | | (C) Fluorine atom-containing polymer | | (D) Acid diffusion control agent | | (E) Solvent | |
|---|---|---|---|---|---|---|---|---|---|---|---|
| | | type | parts by mass | type | parts by mass | type | parts by mass | type | parts by mass | type | parts by mass |
| Example 1 | J-1 | A-1 | 100 | B-1 | 11 | C-1 | 3 | D-2 | 4.5 | E-1/E-2/E-3 | 1,620/700/30 |
| Example 2 | J-2 | A-1 | 100 | B-2 | 8.5 | C-1 | 3 | D-1 | 1 | E-1/E-2/E-3 | 1,620/700/30 |
| Example 3 | J-3 | A-2 | 100 | B-1 | 11 | C-1 | 3 | D-3 | 5.5 | E-1/E-2/E-3 | 1,620/700/30 |
| Example 4 | J-4 | A-2 | 100 | B-2 | 8.5 | C-1 | 3 | D-2 | 4.5 | E-1/E-2/E-3 | 1,620/700/30 |
| Example 5 | J-5 | A-3 | 100 | B-1 | 11 | C-1 | 3 | D-1 | 1 | E-1/E-2/E-3 | 1,620/700/30 |
| Example 6 | J-6 | A-4 | 100 | B-1 | 11 | C-1 | 3 | D-2 | 4.5 | E-1/E-2/E-3 | 1,620/700/30 |
| Example 7 | J-7 | A-5 | 100 | B-2 | 8.5 | C-1 | 3 | D-2 | 4.5 | E-1/E-2/E-3 | 1,620/700/30 |
| Example 8 | J-8 | A-6 | 100 | B-1 | 11 | C-1 | 3 | D-3 | 4.5 | E-1/E-2/E-3 | 1,620/700/30 |
| Example 9 | J-9 | A-7 | 100 | B-1 | 11 | C-1 | 3 | D-1 | 1 | E-1/E-2/E-3 | 1,620/700/30 |
| Example 10 | J-10 | A-8 | 100 | B-2 | 8.5 | C-1 | 3 | D-2 | 4.5 | E-1/E-2/E-3 | 1,620/700/30 |
| Example 11 | J-11 | A-1 | 100 | B-1 | 11 | C-1 | 3 | D-4 | 5 | E-1/E-2/E-3 | 1,620/700/30 |
| Example 12 | J-12 | A-1 | 100 | B-1 | 11 | C-1 | 3 | D-5 | 8.5 | E-1/E-2/E-3 | 1,620/700/30 |

TABLE 2-2

| | Radiation-sensitive resin composition | (A) Component | | (B) Acid generating agent | | (C) Fluorine atom-containing polymer | | (D) Acid diffusion control agent | | (E) Solvent | |
|---|---|---|---|---|---|---|---|---|---|---|---|
| | | type | parts by mass | type | parts by mass | type | parts by mass | type | parts by mass | type | parts by mass |
| Example 13 | J-13 | A-1 | 100 | B-1 | 11 | C-1 | 3 | D-6 | 9.5 | E-1/E-2/E-3 | 1,620/700/30 |
| Example 14 | J-14 | A-5 | 100 | B-2 | 8.5 | C-1 | 3 | D-4 | 5 | E-1/E-2/E-3 | 1,620/700/30 |
| Example 15 | J-15 | A-9 | 100 | B-1 | 11 | C-1 | 3 | D-3 | 5.5 | E-1/E-2/E-3 | 1,620/700/30 |
| Example 16 | J-16 | A-10 | 100 | B-2 | 8.5 | C-1 | 3 | D-2 | 4.5 | E-1/E-2/E-3 | 1,620/700/30 |
| Example 17 | J-17 | A-11 | 100 | B-2 | 8.5 | C-1 | 3 | D-6 | 9.5 | E-1/E-2/E-3 | 1,620/700/30 |
| Example 18 | J-18 | A-12 | 100 | B-1 | 11 | C-1 | 3 | D-2 | 4.5 | E-1/E-2/E-3 | 1,620/700/30 |
| Example 19 | J-19 | A-13 | 100 | B-1 | 11 | C-1 | 3 | D-4 | 5 | E-1/E-2/E-3 | 1,620/700/30 |
| Synthesis Example 17 | j-1 | a-1 | 100 | B-1 | 11 | C-1 | 3 | D-2 | 4.5 | E-1/E-2/E-3 | 1,620/700/30 |
| Synthesis Example 18 | j-2 | a-1 | 100 | B-2 | 8.5 | C-1 | 3 | D-1 | 1 | E-1/E-2/E-3 | 1,620/700/30 |
| Synthesis Example 19 | j-3 | a-2 | 100 | B-1 | 11 | C-1 | 3 | D-2 | 4.5 | E-1/E-2/E-3 | 1,620/700/30 | accordance with this procedure, an exposure dose at which the area through a mask pattern that yield a dot of 55 nm and a pitch of 110 nm forms a hole pattern with a diameter of 55 nm was defined as an optimum exposure dose (Eop) (unit: mJ/cm$^2$). It is to be noted that a scanning electron microscope ("CG-4000", manufactured by Hitachi High-Technologies Corporation) was used for line-width measurement.

Examples 23 to 42 and Comparative Examples 1 to 3

Each resist pattern was formed in a similar manner to Example 22 except that the radiation-sensitive resin composition used and the PEB temperature were as shown in Table 3.
Evaluations
Film loss amount of the resist film was evaluated on a resist film formed according to the following method. In addition, critical dimension uniformity (CDU), mask error enhancement factor (MEEF) and resolution were evaluated on the resist pattern obtained in Examples 22 to 42 and Comparative Examples 1 to 3 using an ArF excimer laser as a light source. The results of evaluations obtained are shown in Table 3.
Film Loss Amount
First, an 8-inch silicon wafer which had been provided with an underlayer antireflective film ("ARC29A", manufactured by Brewer Science, Inc.) having an film thickness of 77 nm, a coating film having an initial film thickness of 150 nm was provided using each of the radiation-sensitive resin compositions prepared in Examples and Comparative Examples, and then soft baking (SB) was carried out at 90° C. for 60 sec. Next, the entire face of the wafer was exposed at the optimum exposure dose (Eop) that allows a hole pattern having a diameter of 55 nm to be formed, without using a mask under conditions involving NA of 0.78 and sigma of 0.90, with Conventional, using an ArF excimer laser scanner ("NSR S306C", manufactured by NIKON Corporation). After the exposure, PEB was carried out at a temperature shown in Table 3 for 60 sec. Subsequently, the film was developed with methyl-n-amyl ketone at 23° C. for 30 sec, and subjected to a rinse treatment with 4-methyl-2-pentanol for 10 sec and dried. The film thickness of remaining coating films after completion of a series of process was measured, and a value obtained by reducing the remaining film thickness from the initial film thickness was defined as a film loss amount (unit: nm). It is to be noted that the film thickness was measured using an optical interferometric film thickness measurement system ("Lambda Ace", manufactured by Dainippon Screen Mfg. Co., Ltd.). With respect to the determined film loss amount, evaluation was made as: "favorable" when the value was less than 20 nm; and "unfavorable" when the value was no less than 20 nm. The values of the film loss amount obtained are shown in Table 3.
Critical Dimension Uniformity (CDU)
A total of 30 hole patterns having a diameter of 55 nm formed at the Eop as defined above in pattern formation of each of Examples and Comparative Examples were subjected to line-width measurement, and an average deviation of the measurement values obtained in the line-width measurement of the total of 30 hole patterns was calculated. Thus, CDU was determined by multiplication of the average deviation by three. With respect to the CDU values, evaluation was made as: "favorable" when the CDU value was less than 2.50; "somewhat favorable" when the CDU value was no less than 2.50 and less than 3.50; and "unfavorable" when the CDU value was no less than 3.50. The values of CDU obtained are shown in Table 3.
Mask Error Enhancement Factor (MEEF)
In a similar manner to pattern formation of each of Examples and Comparative Examples, holes were formed through the resist film using a portion of a mask pattern that yield a dot diameter of 51 nm, 53 nm, 55 nm, 57 nm or 59 nm of the pattern after reduction projection, at the Eop as defined above. The diameters (nm) were plotted along the ordinate with respect to the size (nm) of the mask pattern along abscissa. A straight line was obtained, and the slope of the straight line was determined as MEEF. The MEEF value (slope of the straight line) more approximate to 1 indicates more favorable mask reproducibility. With respect to the MEEF values, evaluation was made as: "favorable" when the MEEF value was less than 3.50; "somewhat favorable" when the MEEF value was no less than 3.50 and less than 4.50; and "unfavorable" when the MEEF value was no less than 4.50. The MEEF values obtained are shown in Table 3.
Resolution
In pattern formation of each of the Examples and Comparative Examples, an exposure was carried out through a mask pattern that yield a pattern having a dot of 55 nm and a pitch of 110 nm after the reduction projection at an exposure dose that is no less than the Eop. The minimum dimension of the hole pattern obtained with an increasing of the exposure dose was determined, which was employed for evaluation of the resolution (unit: nm). Evaluation was made as: "favorable" when the minimum dimension was less than 50 nm; and "unfavorable" when the minimum dimension was no less than 50 nm. The resolutions obtained are shown in Table 3.

TABLE 3

|  | Radiation-sensitive resin composition | PEB temperature (° C.) | Eop (mJ/cm$^2$) | Film reduction amount (nm) | CDU | MEEF | Resolution (nm) |
|---|---|---|---|---|---|---|---|
| Example 20 | J-1 | 105 | 14.0 | 16 | 2.3 | 3.4 | 43 |
| Example 21 | J-2 | 105 | 18.0 | 16 | 2.2 | 3.8 | 43 |
| Example 22 | J-3 | 105 | 13.0 | 12 | 1.9 | 3.2 | 41 |
| Example 23 | J-4 | 105 | 16.5 | 13 | 1.9 | 3.4 | 42 |
| Example 24 | J-5 | 105 | 12.5 | 11 | 1.8 | 3.0 | 40 |
| Example 25 | J-6 | 90 | 14.0 | 13 | 2.0 | 3.4 | 41 |
| Example 26 | J-7 | 80 | 17.0 | 16 | 2.1 | 3.6 | 40 |
| Example 27 | J-8 | 105 | 18.5 | 10 | 2.0 | 2.9 | 40 |
| Example 28 | J-9 | 105 | 15.5 | 14 | 2.7 | 3.3 | 46 |
| Example 29 | J-10 | 100 | 18.5 | 17 | 2.0 | 3.9 | 39 |
| Example 30 | J-11 | 105 | 13.5 | 16 | 2.4 | 3.2 | 43 |

TABLE 3-continued

|  | Radiation-sensitive resin composition | PEB temperature (° C.) | Evaluation results | | | | |
|---|---|---|---|---|---|---|---|
|  |  |  | Eop (mJ/cm²) | Film reduction amount (nm) | CDU | MEEF | Resolution (nm) |
| Example 31 | J-12 | 105 | 11.0 | 17 | 2.1 | 3.3 | 40 |
| Example 32 | J-13 | 105 | 11.5 | 16 | 2.1 | 3.3 | 41 |
| Example 33 | J-14 | 80 | 16.0 | 16 | 2.2 | 3.4 | 40 |
| Example 34 | J-15 | 85 | 12.5 | 17 | 2.1 | 3.1 | 44 |
| Example 35 | J-16 | 95 | 18.0 | 16 | 2.2 | 3.6 | 42 |
| Example 36 | J-17 | 85 | 18.0 | 18 | 2.1 | 3.4 | 43 |
| Example 37 | J-18 | 95 | 12.6 | 16 | 1.9 | 3.4 | 41 |
| Example 38 | J-19 | 85 | 13.0 | 17 | 2.2 | 3.2 | 40 |
| Comparative Example 1 | j-1 | 105 | 16.0 | 25 | 2.7 | 4.3 | 47 |
| Comparative Example 2 | j-2 | 105 | 20.0 | 26 | 2.8 | 4.6 | 51 |
| Comparative Example 3 | j-3 | 105 | 16.5 | 28 | 3.5 | 5.1 | 53 |

As shown in Table 3, according to the resist pattern-forming method of the embodiment of the present invention, film loss during pattern formation of the resist film was successfully prevented, and formation of a resist pattern being superior in CDU and MEEF was enabled. In addition, it was revealed that the radiation-sensitive resin composition of the embodiment of the present invention achieves sufficient resolution.

According to the resist pattern-forming method of the embodiment of the present invention, film loss during pattern formation of the resist film can be prevented, and formation of a resist pattern that is superior in CDU and MEEF is enabled. In addition, the radiation-sensitive resin composition of the embodiment of the present invention also achieves sufficient resolution.

Obviously, numerous modifications and variations of the present invention are possible in light of the above teachings. It is therefore to be understood that within the scope of the appended claims, the invention may be practiced otherwise than as specifically described herein.

The invention claimed is:

1. A resist pattern-forming method comprising:
   coating a radiation-sensitive resin composition on a substrate to provide a resist film;
   exposing the resist film; and
   developing the exposed resist film using a developer solution comprising no less than 80% by mass of an organic solvent,
   wherein the radiation-sensitive resin composition comprises:
   a first polymer which has a weight average molecular weight in terms of the polystyrene equivalent of greater than 6,000 and comprises:
      a first structural unit that comprises an acid-labile group; and
      less than 5 mol % or 0 mol % of a second structural unit that comprises a hydroxyl group;
   a second polymer which comprises:
      a third structural unit which comprises a fluorine atom; and
      a fourth structural unit comprising an acid-labile group which comprises an alicyclic hydrocarbon group;
   a radiation-sensitive acid generator; and
   an acid diffusion controller which comprises a compound comprising an amide group.

2. The resist pattern-forming method according to claim 1, wherein the first structural unit comprises a plurality of kinds of structural units, and at least one of the plurality of kinds of structural units is a fifth structural unit represented by formula (1):

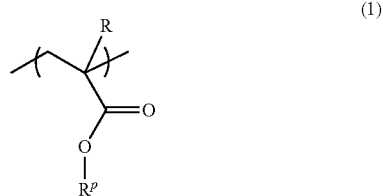

wherein, in the formula (1), R represents a hydrogen atom, a fluorine atom, a methyl group or a trifluoromethyl group; and $R^p$ represents an acid-labile group represented by formula (i):

wherein, in the formula (i), $R^{p1}$ to $R^{p3}$ each independently represent an alkyl group having 1 to 4 carbon atoms or an alicyclic hydrocarbon group having 4 to 9 carbon atoms; or two of $R^{p1}$ to $R^{p3}$ taken together represent a divalent alicyclic hydrocarbon group having 4 to 9 carbon atoms together with the carbon atom to which the two of $R^{p1}$ to $R^{p3}$ bond, and $R^{p1}$ to $R^{p3}$ other than the two of $R^{p1}$ to $R^{p3}$ represents an alkyl group having 1 to 4 carbon atoms or an alicyclic hydrocarbon group having 4 to 9 carbon atoms; or $R^{p1}$ to $R^{p3}$ taken together represent a divalent alicyclic hydrocarbon group having 4 to 9 carbon atoms together with the carbon atom to which $R^{p1}$ to $R^{p3}$ bond.

3. The resist pattern-forming method according to claim 2, wherein $R^{p1}$, $R^{p2}$ and $R^{p3}$ in the formula (i) each independently represent an alkyl group having 1 to 4 carbon atoms; or $R^{p1}$ represents an alkyl group having 1 to 4 carbon atoms, and $R^{p2}$ and $R^{p3}$ taken together represent a divalent alicyclic hydrocarbon group having 4 to 9 carbon atoms together with the carbon atom to which $R^{p2}$ and $R^{p3}$ bond.

4. The resist pattern-forming method according to claim 2, wherein the first structural unit included in the first polymer comprises no less than 60 mol % and no greater than 95 mol % of the fifth structural unit.

5. The resist pattern-forming method according to claim 1, wherein the organic solvent is an alcohol solvent, an ether solvent, a ketone solvent, an amide solvent, an ester solvent, a hydrocarbon solvent or a combination thereof.

6. The resist pattern-forming method according to claim 1, wherein the acid diffusion controller comprises N acetyl-1-adamantylamine, tris(2-hydroxyethyl) isocyanurate, 4-hydroxy-N-amyloxycarbonylpiperidine, or a combination thereof.

7. A radiation-sensitive resin composition comprising:
   a first polymer which has a weight average molecular weight in terms of the polystyrene equivalent of greater than 6,000 and comprises:
      a first structural unit that comprises an acid-labile group; and
      less than 5 mol % or 0 mol % of a second structural unit that comprises a hydroxyl group;
   a second polymer which comprises:
      a third structural unit which comprises a fluorine atom; and
      a fourth structural unit comprising an acid-labile group which comprises an alicyclic hydrocarbon group;
   a radiation-sensitive acid generator; and
   an acid diffusion controller which comprises a compound comprising an amide group,
   the radiation-sensitive resin composition being for use in a resist pattern-forming method comprising:
      using a developer solution comprising no less than 80% by mass of an organic solvent.

8. The radiation-sensitive resin composition according to claim 7, wherein the acid diffusion controller comprises N-acetyl-1-adamantylamine, tris(2-hydroxyethyl) isocyanurate, 4-hydroxy-N-amyloxycarbonylpiperidine, or a combination thereof.

9. A resist pattern-forming method comprising:
   coating a radiation-sensitive resin composition on a substrate to provide a resist film;
   exposing the resist film; and
   developing the exposed resist film using a developer solution comprising no less than 80% by mass of an organic solvent,
   wherein the radiation-sensitive resin composition comprises:
      a first polymer which has a weight average molecular weight in terms of the polystyrene equivalent of greater than 6,000 and comprises:
         a first structural unit that comprises an acid-labile group which comprises an alicyclic hydrocarbon group; and
         less than 5 mol % or 0 mol % of a second structural unit that comprises
         a hydroxyl group;
      a second polymer which comprises:
         a third structural unit which comprises a fluorine atom; and
         a fourth structural unit comprising an acid-labile group which comprises an alicyclic hydrocarbon group;
      a radiation-sensitive acid generator; and
      an acid diffusion controller which comprises a compound comprising an amide group.

10. The resist pattern-forming method according to claim 9, wherein the acid diffusion controller comprises N-acetyl-1-adamantylamine, tris(2-hydroxyethyl) isocyanurate, 4-hydroxy-N-amyloxycarbonylpiperidine, or a combination thereof.

* * * * *